(12) United States Patent
Raehse

(10) Patent No.: US 10,317,443 B2
(45) Date of Patent: Jun. 11, 2019

(54) INTEGRATED CAPACITANCE MEASUREMENT

(71) Applicant: Elmos Semiconductor AG, Dortmund (DE)

(72) Inventor: Norbert Raehse, Falkensee (DE)

(73) Assignee: Elmos Semiconductor AG, Dortmund (DE)

(*) Notice: Subject to any disclaimer, the term of this patent is extended or adjusted under 35 U.S.C. 154(b) by 18 days.

(21) Appl. No.: 15/686,293

(22) Filed: Aug. 25, 2017

(65) Prior Publication Data

US 2018/0340963 A1 Nov. 29, 2018

(30) Foreign Application Priority Data

May 24, 2017 (DE) .................... 10 2017 111 489
Jul. 13, 2017 (EP) .................... 17181172

(51) Int. Cl.
*G01R 27/26* (2006.01)
*H03B 5/20* (2006.01)

(52) U.S. Cl.
CPC .......... *G01R 27/2605* (2013.01); *H03B 5/20* (2013.01)

(58) Field of Classification Search
CPC .............................. G01R 27/2605; H03B 5/20
USPC ................................................. 324/679, 658
See application file for complete search history.

(56) References Cited

U.S. PATENT DOCUMENTS

| 5,726,579 A * | 3/1998 | Masuda .................. G01D 5/24 324/658 |
| 5,963,043 A | 10/1999 | Nassif |
| 8,836,349 B2 * | 9/2014 | Rocznik .............. G01R 27/2605 324/679 |
| 2011/0012618 A1 | 1/2011 | Teterwak et al. |

FOREIGN PATENT DOCUMENTS

| DE | 36 39 070 A1 | 8/1987 |
| DE | 282 769 A5 | 9/1990 |
| DE | 282769 A5 | 9/1990 |

(Continued)

OTHER PUBLICATIONS

"FDC2x1x EMI-Resistant 28-Bit, 12-Bit Capacitance-to-Digital Converter for Proximity and Level Sensing Applications", Texas Instruments, Jun. 2015, www.ti.com.

(Continued)

*Primary Examiner* — Reena Aurora
(74) *Attorney, Agent, or Firm* — Bejin Bieneman PLC

(57) ABSTRACT

An apparatus for measuring the capacitance to be measured is proposed. It comprises a first sine-wave oscillator, the measuring oscillator, and a second sine-wave oscillator, the reference oscillator. The frequency of the output signal of the measuring oscillator, hereinafter also referred to as measuring frequency, is dependent on the capacitance to be measured. The frequency of the output signal of the reference oscillator, hereinafter also referred to as reference frequency, is dependent on a reference capacitance. The apparatus comprises a sub-apparatus which produces the ratio of the frequency value of the frequency of the output signal of the reference oscillator and the frequency value of the frequency of the output signal of the measuring oscillator and subsequently squares this ratio to provide the result of this squaring as a measured value.

9 Claims, 15 Drawing Sheets

(56) References Cited

FOREIGN PATENT DOCUMENTS

| DE | 40 33 053 C1 | 3/1992 |
|----|---|---|
| EP | 0213727 A2 | 3/1987 |
| EP | 0411058 B1 | 1/1992 |
| EP | 0494926 B1 | 2/1994 |
| EP | 1862806 A1 | 12/2007 |
| JP | 2003107026 A | 4/2003 |

OTHER PUBLICATIONS

Nizamani, Abdul Shakoor (1993) Measurement of capacitance using identical oscillators, International Journal of Electronics; 75:5, 979-983, DOI: 10.1080/00207219308907176; ISSN: 0020-7217 (Print) 1362-3060 (Online) Journal homepage: http://www.tandfonline.com/loi/tetn20; http://dx.doi.org/10.1080/00207219308907176.

Lepkowski, Jim; State-Variable Oscillator Suits Ratiometric Capacitive Sensors, Electronic Design, Sep. 30, 2002; http://electronicdesign.com/components/state-variable-oscillator-suits-ratiometric-capacitive-sensors.

Lepkowski, Jim; Young, Christopher; ON Semiconductor: Designing RC oscillator circuits with low voltage operational amplifiers and comparators for precision sensor applications. Application Note AND8054/D, Phoenix, Arizona, USA, Feb. 2002, Rev. 1., S. 1-28-Firmenschrift.

Nizamani A S: "Measurement of Capacitance Using Identical Oscillators", International Journal of Electronics, Taylor and Francis Ltd., London, GB, Bd. 75, Nr. 5, Nov. 1, 1993 (Nov. 1, 1993), Seiten 979-983, XP000422097, ISSN: 0020-7217.

\* cited by examiner

INTEGRATED CAPACITANCE MEASUREMENT

CROSS-REFERENCE TO RELATED APPLICATIONS

This application claims priority to German Application No. DE 10 2017 111 489.0, filed on May 24, 2017, and European Application No. 17 181 172.2, filed on Jul. 13, 2017, which applications are hereby incorporated herein by reference in their entireties.

PREAMBLE

The proposed apparatus is a microelectronically integrable circuit for measuring unknown capacitances. It is possible to take a high-resolution measurement insusceptible to interference of a (sensor) capacitance or the capacitance ratio between two ratiometric sensor capacitances, i.e. a differential sensor capacitance.

GENERAL INTRODUCTION

Most sensors known in prior art are capacitive sensors. Against this background an efficient measurement of unknown capacitances poses a permanent problem with regard to this capacitive sensor technology.

PRIOR ART

General Survey of Prior Art

The most widely spread solutions concerning capacitance measurements are based on switched-capacitor (SC) circuits. They have the principle-related disadvantage of a high susceptibility to interference at multiple harmonics of their sampling frequency and are thus a priori unsuitable for capacitance measurement in many cases of application.

Therefore the following discussion focuses on methods wherein the capacitance is sinusoidally excited by means of a resonant circuit. These methods are technically not related to SC circuits such that SC circuits are not further discussed below.

DD-A-282 769 describes a capacitance measuring apparatus having two identical quartz oscillators and one reference capacitance (trimmer capacitance).

DE-A-36 39 070 describes producing of a frequency ratio of a reference capacitance and a capacitance to be measured for capacitance determination.

U.S. Pat. No. 5,963,043 relates to the measurement of an unknown capacitance using three identical ring oscillators.
Sine-Wave-Oscillator-Based Solutions With the aid of the integrated circuit FDC2112 available in prior art sensor capacitances are measured by means of a resonant circuit (see "FDC2x1x EMI-Resistant 28-Bit, 12-Bit Capacitance-to-Digital Converter for Proximity and Level Sensing Applications").

For this purpose, one external coil per sensor is provided. With the aid of this external coil an LC resonant circuit is established and by means of components located in the integrated circuit this vibration is undamped. Such a circuit is also referred to as resonant driver. A reference clock is used to count the number of vibrations and their duration for obtaining a digital value as a measured value. From the oscillation frequency according to the equation $$f = \frac{1}{2\pi\sqrt{LC}}$$

the capacitance can be calculated. The advantage offered by this method is that the vibration is almost exclusively dependent on the value of the external inductor L (hereinafter referred to as $L_{MEAS}$) and the value of the capacitance C to be measured (hereinafter referred to as $C_{var}$). Thus, no measurement error occurs due to drift effects or temperature effects of components of the integrated microelectronic circuit.

In addition, the resonant circuit principle offers a high interference immunity outside the resonant frequency of the LC resonant circuit. It is however disadvantageous that the concept requires an external inductor L. Such an external inductor ($L_{MEAS}$) entails relatively high costs as compared with a purely integrated microelectronic solution. Further, the vibration frequency of the LC resonant circuit cannot be dynamically changed since it is exclusively dependent on the external equipment and the measuring object. Thus, no counter strategy can be developed according to which the frequency of the LC resonant circuit is changed in the case of interferences occurring in the range of the resonant frequency. In particular, a frequency hopping, i.e., the stochastic change of the oscillation frequency over time, is not possible. Further, in this method the disadvantages known from prior art caused by the measuring inductor ($L_{MEAS}$) are reflected in the behavior of the measuring apparatus. Said disadvantages are the drift and temperature dependence of the external measuring inductor, for example.

For this reason, integrable circuit concepts are contemplated hereinafter which do not require any external components, if possible. From prior art a resonant circuit type is known which is also referred to as "state-variable oscillator". The latter is particularly well suited. In the case of this resonant circuit type the effects of parasitic capacitances of the sensor are particularly easy to eliminate.
State-Variable Oscillator This is a known classical analog principle. This principle is described in the document "State-Variable Oscillator Suits Ratiometric Capacitive Sensors", for example. Another explanation is found in the document "Designing RC Oscillator Circuits with Low Voltage Operational Amplifiers and Comparators for Precision Sensor Applications". This document also describes the application for measuring capacitances. Here, the capacitance is determined by means of a single resonant circuit. Further, the resonant circuit is not controlledly undamped. The amplitude limitation takes place by saturation of the feedback circuit of the resonant circuit. This leads to the following disadvantages as compared with the solution proposed below:

The measuring result is strongly dependent on the scattering and the temperature response of the resistors in the microelectronically integrated circuit. These scatterings and parasitic temperature responses must be compensated for in a complex manner.

The simple amplitude saturation for amplitude setting typically leads to a non-ideal behavior which results in a nonlinearity even after a digital correction of the root function. Prior art does not offer any strategy for the case in which an external interference occurs in the range of the resonant frequency.

From Abdul Shakoor Nizamani, "Measurements of capacitance using identical oscillators" International Journal of Electronics, Volume 75, 1993, Issue 5, the use of two identical oscillators is known. Here, one oscillator is used as a reference oscillator. The result is determined by comparative counting of the vibration periods within a time window. The circuit described here is of a discrete configuration. The capacitance ($C_{var}$) to be measured is excited by a triangular signal.

This prior art apparatus offers the following advantages:

The temperature drift is balanced if it is assumed that the two oscillators do not differ from each other. The ratio of the frequency ($f_{ref}$) of the output signal of the reference oscillator to the frequency ($f_{MEAS}$) of the measuring oscillator which comprises the capacitance ($C_{var}$) to be measured is equal to the ratio of the capacitance of the capacitance ($C_{var}$) to be measured to the capacitance of the reference capacitance ($C_{ref}$) of the reference oscillator. Thus, the following applies $$\frac{f_{mess}}{f_{ref}} = k \frac{C_{ref}}{C_{mess}}.$$

Here, k is a proportionality constant. Thus, in contrast to the prior art technology described above, a squaring of the frequency ratios for eliminating the root is no longer required. This results in a resolution comprising one bit more at the same time resolution.

The method described in the publication of Abdul Shakoor Nizamani, "Measurements of capacitance using identical oscillators" International Journal of Electronics Volume 75, 1993, Issue 5, has the disadvantage of the triangular excitation of the capacitance ($C_{var}$) to be determined and the reference capacitance ($C_{ref}$). This is due to the use of harmonics which leads to a susceptibility to interference with regard to EMC influences (EMC=electromagnetic compatibility). Sources of interference can emit into the sensor assembly and affect the measuring result at the harmonics. Further, in oscillators, such as classical RC oscillators, where a ramp is applied to the capacitance, the temperature behavior of the comparator and the switching, for example, are incorporated in a nonlinear manner in the frequency. Thus a nonlinear temperature coefficient is produced. Further, simple counting does not allow for the necessary resolution in the required time windows to be realized.

Object of the Proposed Apparatus

It is therefore an object of the proposed apparatus to provide a solution which eliminates the disadvantages of prior art described above and offers further advantages.

It is intended to allow for measurement and digitalization of a capacitance. Such a converter is also referred to as capacitance-to-digital converter (CDC). Said converter is designed to have a low susceptibility to radiation in a wide frequency range (kHz to GHz, for example). At the same time, said converter is designed to have a high resolution (<1 femtoFarad (fF)(LSB) at 1 ms measuring time and an absolute accuracy. In addition, a fully integrable solution is to be realized which does not require any external reference capacitance or external inductor outside the integrated microelectronic circuit which includes the fully integrable solution.

This object is achieved with an apparatus and a method according to the disclosure.

Achievement of the Object

The solution is based on the frequency comparison between two sine-wave resonant circuits for determining the capacitance ($C_{var}$) to be measured, wherein by the occurring sinusoidal excitation of the capacitance ($C_{var}$) to be measured and a reference capacitance ($C_{ref}$), the susceptibility to external radiation interferences is reduced as compared with prior art.

According to the principle applied, the frequency of an oscillator, which forms part of a microelectronically integrated circuit, is dependent at least on the resistors used, which form part of this microelectronic circuit, and the capacitances which also form part of this microelectronic circuit (IC). These capacitances are hereinafter referred to as on-chip capacitances. The corresponding resistors are hereinafter referred to as on-chip resistors. According to experience, on-chip capacitances offer a temperature stability which is sufficiently high for the use intended according to the disclosure. However, the on-chip resistors generally show a high temperature dependence (typically approximately 5%). Thus, the temperature dependence is typically proportionally incorporated in the vibration frequency of the respective oscillator.

In a particularly preferred variant the same resistor types are used for the integrated circuit (IC). Thus, it is possible to realize that the temperature dependence has the same effect on all of the placed resistors, i.e. the resistors keep their relationship to each other in an adequately exact manner. Such a procedure is also known as "matching". This allows for the influence of the resistance drift on the measuring result to be eliminated to a large extent.

The apparatus proposed according to the disclosure is elucidated with reference to FIG. 1. The capacitance ($C_{var}$) to be measured comprises a first terminal and a second terminal. The first terminal of the capacitance ($C_{var}$) to be measured is connected to a first terminal (Var) of a measuring oscillator ($Q_{MEAS}$). The second terminal of the capacitance ($C_{var}$) to be measured is connected to a second terminal (Det) of a measuring oscillator ($Q_{MEAS}$). This measuring oscillator ($Q_{MEAS}$) generates a first (or measuring) oscillator signal ($S_{MEAS}$).

A reference capacitance ($C_{ref}$) comprises a first terminal and a second terminal. The reference capacitance ($C_{ref}$) is connected to a reference oscillator ($Q_{REF}$) via its first terminal. The reference capacitance ($C_{ref}$) is connected to a second terminal (N2) of a reference oscillator ($Q_{REF}$) via its second terminal. The reference oscillator generates a second (or reference) oscillator signal ($S_{REF}$). These two oscillators ($Q_{MEAS}$, $Q_{REF}$) represent similar microelectronic circuit portions of a microelectronic circuit (IC). Preferably, they are configured in a "matched" manner. This means that the layouts of these microelectronic circuit portions are preferably of equal configuration. The parasitic properties of these two oscillators ($Q_{REF}$, $Q_{MEAS}$) should therefore typically drift in the same manner. Preferably, the circuit portions of the two oscillators ($Q_{MEAS}$, $Q_{REF}$) are placed on a substrate of the microelectronic circuit so near to each other that they are in the same thermal state.

The first oscillator signal ($S_{MEAS}$) is preferably filtered in an optional low pass filter (LPF1) and converted into a first digital or binary data flow (ds1) by a first analog-to-digital converter (INV1), preferably a simple inverter or the like.

The second oscillator signal ($S_{REF}$) is preferably filtered by a second low pass filter (LPF2) and converted into a second digital or binary data flow (ds2) by a second analog-to-digital converter (INV2), preferably a simple inverter or the like.

If the frequency ($f_{REF}$) of the second oscillator signal ($S_{REF}$) is divided by the frequency ($f_{MEAS}$) of the first oscillator signal ($S_{MEAS}$) the following relation is obtained between the measured value of the capacitance ($C_{var}$) to be measured and the reference capacitance ($C_{ref}$) when sine-wave oscillators are used:

$$C_{var} = C_{ref}\left(\frac{f_{REF}}{f_{MEAS}}\right)^2$$

Now the measuring signal is influenced only by the value of the reference capacitance ($C_{ref}$) which preferably forms part of the microelectronically integrated circuit (IC). Its temperature drift is typically predetermined by the design and the temperature drift can be determined during the manufacturing process.

For measuring the frequency ratio ($f_{REF}/f_{MEAS}$) the vibrations of the first oscillator signal ($S_{MEAS}$) and of the second oscillator signal ($S_{REF}$) must be counted relative to each other. Simple counting as in Abdul Shakoor Nizamani, "Measurements of capacitance using identical oscillators" International Journal of Electronics Volume 75, 1993, Issue 5, does however not result in the required resolution per time. During the preparation of this proposal it thus became evident that it is advantageous to measure the phase positions relative to each other. This is carried out using an additional high-frequency oscillator (HF-OSC) which generates high-frequency counting pulses. The demands made on this high-frequency oscillator (HF-OSC) are not very high since its absolute frequency is not relevant and the high-frequency oscillator (HF-OSC) is used only for comparing the two main oscillators according to the proposal presented here.

A possible method for measuring the frequency ratio ($f_{REF}/f_{MEAS}$) uses a first divisor (D1). The first divisor (D1) divides the frequency of the first digital or binary data flow (ds1) by a factor n and thus generates a third digital or binary data flow (ds3). The third digital or binary data flow (ds3) may preferably assume a first logic level and a second logic level. A first counter (CNT1) counts the high-frequency counting pulses of the high-frequency oscillator (HF-OSC) for the time period during which the third digital or binary data flow (ds3) assumes the first logic level. When the second logic level appears at the third digital or binary data flow (ds3) the first counter (CNT1) stops the counting process and the first counting result appears at the output of the first counter (CNT1). When a first logic level appears again at the third digital or binary data flow (ds3) the first counter (CNT1) starts counting again, preferably at zero. The preceding first counting result is preferably continued to be outputted.

This potentially applicable method for measuring the frequency ratio ($f_{REF}/f_{MEAS}$) further uses a second divisor (D2). The second divisor (D2) divides the frequency of the second digital or binary data flow (ds2) by a factor m and thus generates a fourth digital or binary data flow (ds4). The fourth digital or binary data flow (ds4) may preferably assume a first logic level and a second logic level. A second counter (CNT2) counts the high-frequency counting pulses of the high-frequency oscillator (HF-OSC) for the time period during which the fourth digital or binary data flow (ds4) assumes a first logic level. When the second logic level appears at the fourth digital or binary data flow (ds4) the second counter (CNT2) stops the counting process and the second counting result appears at the output of the second counter (CNT2). When the first logic level appears again at the fourth digital or binary data flow (ds4) the second counter (CNT2) starts counting again, preferably at zero. Preferably, the preceding first counting result continues to be outputted.

The first digital or binary data flow (ds1) thus serves as a gate signal for the first high-frequency pulse counter (CNT1) after the division by n. The second digital or binary data flow (ds2) correspondingly serves as a gate signal for the second high-frequency pulse counter (CNT2) after the division by m.

The proposed method then comprises the following steps with exemplary n and m as natural numbers with in particular n=m=1:

Step 1: The first high-frequency counter (CNT1) and the second high-frequency counter (CNT2) are reset.

Step 2: After the arrival of an edge, namely the first starting edge, of the first digital or binary data flow (ds1) the first high-frequency pulse counter (CNT1) starts counting the high-frequency counting pulses of the high-frequency oscillator (HF-OSC). It may be predetermined whether the first starting edge is to be a trailing edge or a rising edge or any edge. At the same time the first high-frequency pulse counter (CNT1) starts counting the following edges, the first counting edges, of the first digital or binary data flow (ds1). It may be predetermined whether the first starting edges are to be trailing edges or rising edges or any edges. This means that the first counter (CNT1) counts, as from the starting edge of the first data flow (ds1) until it reaches the nth counting edge, both their number and the number of the high-frequency pulses supplied by the high-frequency oscillator (HF-OSC) until it reaches the nth counting edge of the first data flow (ds1).

Step 3: After the arrival of an edge, the second starting edge, of the second digital or binary data flow (ds2) the second high-frequency pulse counter (CNT2) starts counting the high-frequency counting pulses of the high-frequency oscillator (HF-OSC). It may be predetermined whether the first starting edge is to be a trailing edge or a rising edge or any edge. At the same time the second high-frequency pulse counter (CNT2) starts counting the following edges, the second counting edges, of the second digital or binary data flow (ds2). It may be predetermined whether the second starting edges are to be trailing edges or rising edges or any edges. This means that the second counter (CNT2) counts, as from the starting edge of the second data flow (ds2) until it reaches the nth counting edge, both their number and the number of the high-frequency pulses supplied by the high-frequency oscillator (HF-OSC) until it reaches the nth counting edge of the second data flow (ds2).

The steps 2 and 3 chronologically follow the first step. The sequence of the steps 2 and 3 is preferably dependent on the arrival of the respective starting edges for the respective counting processes.

Step 4: When the nth counting edge of the first data flow (ds1) arrives the first high-frequency pulse counter (CNT1) stops counting the high-frequency counting pulses of the high-frequency oscillator (HF-OSC) and preferably transfers its first counter reading to a first output register and thus outputs this first counter reading.

Step 5: When the mth counting edge of the second data flow (ds2) arrives the second high-frequency pulse counter (CNT2) stops counting the high-frequency counting pulses of the high-frequency oscillator (HF-OSC) and preferably transfers its second counter reading to a second output register and thus outputs this second counter reading.

The steps 4 and 5 preferably chronologically follow steps 1 to 3. The sequence of the steps 4 and 5 is preferably dependent on the arrival of the respective stopping edges for the respective counting processes.

Then the first output register contains a value multiplied by n which is proportional to the reciprocal value of the frequency ($f_{MEAS}$) of the first oscillator signal ($S_{MEAS}$).

Then the second output register contains a value multiplied by m which is proportional to the reciprocal value of the frequency ($f_{REF}$) of the second oscillator ($f_{REF}$) signal ($S_{REF}$).

Thus by a simple division of the value of the first output register by the value of the second output register in the division block (/) a value can be determined which is proportional to $$\left(\frac{f_{REF}}{f_{MEAS}}\right)$$

The factor n/m is also proportionally incorporated. Thus by a purposeful change of n or m a calibration and an amplification, respectively, can be realized. However, particularly preferred is the selection of n=m.

The final capacitance result (Out) is obtained by squaring in the squaring block (^2).

During the preparation of the proposal it has turned out that non-ideal properties of the circuit, such as parasitic capacitances and the resistance-dependent finite bandwidth of operational amplifiers in the circuit, are merely shown as temperature-independent offset and amplification error of the final capacitance result (Out). However, this error is easy to calibrate out.

Thus, this is a method for determining a capacitance ($C_{var}$) to be measured, comprising the steps of:
 providing a reference capacitance ($C_{ref}$) having a known capacitance;
 generating a sinusoidal first oscillator signal ($S_{MEAS}$) by means of a measuring oscillator ($Q_{MEAS}$) whose measuring frequency ($f_{MEAS}$) is dependent on the capacitance value of the capacitance ($C_{var}$) to be measured;
 generating a sinusoidal second oscillator signal ($S_{REF}$) by means of a reference oscillator ($Q_{REF}$) whose reference frequency ($f_{REF}$) is dependent on the capacitance value of the reference capacitance ($C_{ref}$);
 generating a first digital or binary data flow (ds1) from the first oscillator signal ($S_{MEAS}$), in particular by means of a first digital-to-analog-converter (INV1), wherein the first digital or binary data flow (ds1) may assume at least a first and a second logic state;
 generating a second digital or binary data flow (ds2) from the second oscillator signal ($S_{REF}$), in particular by means of a second analog-to-digital converter (INV2), wherein the second digital or binary data flow (ds2) may assume at least a first and a second logic state;
 generating high-frequency counting pulses, in particular by means of a high-frequency oscillator (HF-OSC);
 incrementing a first counting value when the first digital or binary data flow (ds1) is in the second logic state;
 incrementing a second counting value when the second digital or binary data flow (ds2) is in the second logic state;
 taking over the first counting value as a first result value when the logic state of the first digital or binary data flow (ds1) changes from the second logic state to the first logic state and preferably subsequent resetting of the first counting value;
 taking over the second counting value as a second result value when the logic state of the second digital or binary data flow (ds2) changes from the second logic state to the first logic state and preferably subsequent resetting of the second counting value;
 dividing the second result value by the first result value and squaring the result of this division;
 outputting or using the result of the squaring as the measured value.

In FIG. 2 a suitable measuring oscillator ($Q_{MEAS}$) is shown and it is proposed to use it as a state-variable oscillator, i.e. as a measuring oscillator ($Q_{MEAS}$).

The proposed measuring oscillator ($Q_{MEAS}$) is composed of a first amplifier (V1), a second amplifier (V2) and a third amplifier (V3). They are interconnected in series to form a ring oscillator. The first amplifier (V1), together with the first resistor (R1) and the capacitance ($C_{var}$) to be measured, forms a first integrator. The subsequent second amplifier (V2) is interconnected with the two third resistors (R3) to form an inverting amplifier. The subsequent third amplifier (V3) is interconnected with a second capacitance (C2) and a second resistor (R2) to form another integrator. The sequence of the integrators and the inverting amplifier is exchangeable. The number of amplifier stages may be increased, whereby, however, the area needed is increased.

The amplitude at the first input terminal (Var) of the measuring oscillator ($Q_{MEAS}$), i.e. the first terminal of the capacitance ($C_{var}$) to be measured, changes in a root-like manner with respect to the capacitance of the capacitance ($C_{var}$) to be measured. Thereby the dynamic range of the circuit is increased. When ideal operational amplifiers are used as amplifiers (V1, V2, V3) the following relation is obtained for the output frequency ($f_{MEAS}$) of the first oscillator signal ($S_{MEAS}$) as the output signal of the measuring oscillator ($Q_{MEAS}$):

$$f_{MEAS} = \frac{1}{2\pi\sqrt{C_{var}C_2 R_1 R_2}}$$

In FIG. 3 a suitable reference oscillator ($Q_{REF}$) matching the measuring oscillator ($Q_{MEAS}$) of FIG. 2 is shown and it is proposed to use the former as a state-variable oscillator, i.e. as a reference oscillator ($Q_{REF}$) The reference oscillator ($Q_{REF}$) preferably matches the measuring oscillator ($Q_{MEAS}$), i.e. is configured in the same manner.

The proposed reference oscillator ($Q_{REF}$) is composed of a fourth amplifier (V4), a fifth amplifier (V5) and a sixth amplifier (V6). Again, they are interconnected in series to form a ring oscillator. The fourth amplifier (V4), together with the first resistor (R1) and the reference capacitance ($C_{ref}$), forms a first integrator. The value and the geometry of this first resistor (R1) are preferably equal to the value and the geometry of the first resistor (R1) of the measuring oscillator ($Q_{MEAS}$) of FIG. 2. The subsequent fifth amplifier (V5) is interconnected with the two third resistors (R3) to form an inverting amplifier. The value and the geometry of these third resistors (R3) are preferably equal to the value and the geometry of the third resistors (R3) of the measuring oscillator ($Q_{MEAS}$) of FIG. 2. It should be noted that in the example of the measuring oscillator ($Q_{MEAS}$) of FIG. 2 as well as in the example of the reference oscillator ($Q_{REF}$) of FIG. 3 these are always two identical third resistors (R3). The subsequent sixth amplifier (V6) is interconnected with a second capacitance (C2) and a second resistor (R2) to form another integrator. The value and the geometry of this second resistor (R2) are preferably equal to the value and the geometry of the second resistor (R2) of the measuring oscillator ($Q_{MEAS}$) of FIG. 2. The value and the geometry of this second capacitance (C2) are preferably equal to the value and the geometry of the second capacitance (C2) of the measuring oscillator ($Q_{MEAS}$) of FIG. 2. The sequence of the integrators and the inverting amplifier is exchangeable. The number of amplifier stages may be increased, whereby, however, the area needed is increased.

The amplitude at the second input terminal (N2) of the reference oscillator ($Q_{REF}$), i.e. the first terminal of the reference capacitance ($C_{var}$), changes in a root-like manner with respect to the capacitance of the reference capacitance ($C_{ref}$). Thereby the dynamic range of the circuit is increased again. When ideal operational amplifiers are used as amplifiers (V4, V5, V6) the following relation is obtained for the output frequency ($f_{REF}$) of the second oscillator signal ($S_{REF}$) as the output signal of the reference oscillator ($Q_{REF}$):

$$f_{REF} = \frac{1}{2\pi\sqrt{C_{ref}C_2R_1R_2}}$$

For the ratio of the frequencies the following applies:

$$C_{var} = C_{ref}\left(\frac{f_{REF}}{f_{MEAS}}\right)^2$$

Measurement of Differential Capacitance Ratios

In some applications, it is necessary to measure a differential capacitance using a center tap. This is also possible in a variant of the method.

FIG. 4 shows a variant of the measuring apparatus having a first capacitance ($C_{var1}$) to be measured and a second capacitance ($C_{var2}$) to be measured as well as a first reference capacitance ($C_{ref1}$) and a second reference capacitance ($C_{ref2}$). The ratio of the capacitance of the first capacitance ($C_{var1}$) to be measured to the capacitance of the second capacitance ($C_{var2}$) to be measured is to be determined by means of the apparatus shown in FIG. 4.

FIG. 5 shows an exemplary measuring oscillator ($Q_{MEAS}$) for an apparatus according to FIG. 4. The sine-wave oscillator of FIG. 5 comprises two integrators and a capacitive inverter.

The fourth resistor (R4) plotted in dotted lines and the fifth resistor (R5) plotted in dotted lines are preferably very highly resistive and only serve for direct-voltage stabilization of the operating point of the second amplifier (V2).

However, they also cause a capacitance-independent (un)damping such that the demands made on the amplitude control of the sine-wave oscillator are increased. Further, it is also conceivable to adjust the direct-voltage charge of one or a plurality of the capacitances ($C_1$, $C_2$, $C_{var1}$, $C_{var2}$) instead of the two resistors (R4, R5) by means of active components.

When ideal operational amplifiers are used as amplifiers (V1, V2, V3) the following relation is obtained for this variant for the output frequency ($f_{MEAS}$) of the first oscillator signal ($S_{MEAS}$) as the output signal of the measuring oscillator ($Q_{MEAS}$):

$$f_{MEAS} = \frac{1}{2\pi\sqrt{C_1C_2R_1R_2\frac{C_{var1}}{C_{var2}}}}$$

FIG. 6 shows an exemplary reference oscillator ($Q_{REF}$) for an apparatus according to FIG. 4. Again, the sine-wave oscillator of FIG. 6 comprises two integrators and a capacitive inverter. Again, it is preferably configured such that it matches the measuring oscillator ($Q_{MEAS}$) of FIG. 5.

The fourth resistor (R4) plotted in dotted lines and the fifth resistor (R5) plotted in dotted lines are preferably very highly resistive and only serve for direct voltage stabilization of the operating point of the second amplifier (V2). As above, the fourth resistor (R4) and the fifth resistor (R5) of this reference oscillator ($Q_{REF}$) are configured such that they match the fourth resistor (R4) and the fifth resistor (R5) of the measuring oscillator ($Q_{MEAS}$) of FIG. 5.

However, they also cause a capacitance-independent (un)damping such that the demand made on the amplitude control of the sine-wave oscillator is increased. Further, it is also conceivable to adjust the direct-voltage charge of one or a plurality of the capacitances ($C_1$, $C_2$, $C_{ref1}$, $C_{ref2}$) instead of the two resistors (R4, R5) by means of active components.

When ideal operational amplifiers are used as amplifiers (V4, V5, V6) the following relation is obtained for this variant for the output frequency ($f_{REF}$) of the second oscillator signal ($S_{REF}$) as the output signal of the reference oscillator ($Q_{REF}$):

$$f_{REF} = \frac{1}{2\pi\sqrt{C_1C_2R_1R_2\frac{C_{ref1}}{C_{ref2}}}}$$

The amplitudes occurring at the first terminal (Var1) of the measuring oscillator ($Q_{MEAS}$) and at the second terminal (Var2) of the measuring oscillator ($Q_{MEAS}$) are proportional to the capacitance ratio, whereby the dynamic range is restricted. Further, the direct-voltage control of the direct-voltage operating point of the second amplifier (V2) of the measuring oscillator ($Q_{MEAS}$) and the fifth amplifier (V5) of the reference oscillator ($Q_{REF}$) each cause an additional complexity. Therefore it is advisable to revert to the variant suggested in FIGS. 1 to 3 for measuring a single capacitance ($C_{var}$) instead of this variant of FIGS. 4 to 6 with a fixed second capacitance ($C_{var2}$). However, it must be considered which variant is better suited with regard to susceptibility to interference since they possess different frequency responses to interferences which may be advantageous or disadvantageous depending on the type of interference.

Both variants (FIGS. 1 to 3 and FIGS. 4 to 6) offer the advantage that the influence of parasitic capacitances is minimized because there is a separation between voltage excitation (at the first terminal of the measuring oscillator ($Q_{MEAS}$)) and measurement of the current at a node with a fixed potential (DET-terminal). The first amplifier (V1) causes this fixed potential at this node (second terminal of the measuring oscillator ($Q_{MEAS}$)). Other arrangements, for example the use of two differentiators instead of the integrators, do not offer this advantage.

For a stable vibration as an output signal ($S_{REF}$, $S_{MEAS}$) of the respective sine-wave oscillators ($Q_{MEAS}$, $Q_{REF}$) to be realized, an amplitude control for the respective vibration amplitude is reasonable. It has been recognized that a limitation of the vibration amplitude by saturation of the amplifiers (V1, V2, V3, V4, V5, V6) is not sufficient since this amplitude strongly scatters during the manufacture of the apparatus and leads to poor matching between the reference oscillator ($Q_{REF}$) and the measuring oscillator ($Q_{MEAS}$) in real circuits.

The proposed amplitude control first comprises measuring of the amplitude. It has been recognized that the amplitude is particularly easy to measure when the fact is utilized that two vibrations offset by 90° occur in the resonant circuit of FIGS. 2 and 3. The same applies to FIGS. 5 and 6. These vibration signals in the sine-wave oscillators ($Q_{MEAS}$, $Q_{REF}$) represent a sinusoidal and a cosinusoidal signal. The one vibration signal occurs at the first terminal (Var) of the measuring oscillator ($Q_{MEAS}$) and the second terminal (N2) of the reference oscillator ($Q_{REF}$), respectively. The other vibration signal occurs at the first oscillator signal ($S_{MEAS}$) of the measuring oscillator ($Q_{MEAS}$) and the second oscillator signal ($S_{REF}$) of the reference oscillator ($Q_{REF}$), respectively. The voltage at the first oscillator signal ($S_{MEAS}$) of the measuring oscillator ($Q_{MEAS}$) and the second oscillator signal ($S_{REF}$) of the reference oscillator ($Q_{REF}$), respectively, is always a maximum voltage or at the peak of the vibration when the signal at the first terminal (Var) of the measuring oscillator ($Q_{MEAS}$) and the second terminal (N2) of the reference oscillator ($Q_{REF}$), respectively, has a zero crossing in a defined direction. For measuring the amplitude at the first oscillator signal ($S_{MEAS}$) of the measuring oscillator ($Q_{MEAS}$) and the second oscillator signal ($S_{REF}$) of the reference oscillator ($Q_{REF}$), respectively, an analog sample-and-hold circuit (analog sample-and-hold element) can be used at the first oscillator signal ($S_{MEAS}$) of the measuring oscillator ($Q_{MEAS}$) and the second oscillator signal ($S_{REF}$) of the reference oscillator ($Q_{REF}$), respectively, which accepts the value every time when at the first terminal (Var) of the measuring oscillator ($Q_{MEAS}$) and the second terminal (N2) of the reference oscillator ($Q_{REF}$), respectively, the voltage has a trailing edge during the zero crossing.

FIG. 7 shows a modification of FIG. 1. An amplitude control ($AC_{MEAS}$) of the measuring oscillator ($Q_{MEAS}$) controls the amplitude of the first oscillator signal ($S_{MEAS}$). An amplitude control ($AC_{REF}$) of the reference oscillator ($Q_{REF}$) controls the amplitude of the second oscillator signal ($S_{REF}$).

Other types of amplitude measurements, such as an amplitude demodulation, are also conceivable. The proposed amplitude control secondly comprises control of the amplitude and undamping, respectively. This undamping is realized by an adjustable virtual negative resistor (NR1). This is carried out by means of an additional auxiliary operational amplifier between the first terminal (Var) of the measuring oscillator ($Q_{MEAS}$) and the second terminal (N2) of the reference oscillator ($Q_{REF}$), respectively, on the one hand and the second terminal (Det) of the measuring oscillator ($Q_{MEAS}$) and the first terminal of the reference oscillator ($Q_{REF}$), respectively, on the other hand. In the case of the measuring oscillator ($Q_{MEAS}$) the virtual negative resistor (NR1) thus bridges the capacitance ($C_{var}$) to be measured and in the case of the reference oscillator ($Q_{REF}$) it bridges the reference capacitance ($C_{ref}$). This is illustrated in FIG. 8 for the measuring oscillator ($Q_{MEAS}$) and in FIG. 9 for the reference oscillator ($Q_{REF}$). This leads to the strongest reduction of the influence of the parasitic resistance occurring in the application between the VAR terminal, the first terminal (Var), of the measuring oscillator ($Q_{MEAS}$) and the second terminal (Det) of the measuring oscillator ($Q_{MEAS}$) on the measuring result. In addition, the control is then most stable with regard to parameter variations during the manufacture of the microelectronic circuit (IC).

FIG. 10 shows an example of an amplitude control ($AC_{MEAS}$) for the measuring oscillator ($Q_{MEAS}$). A comparator (comp) generates a signal for the clock input (ck) of a sample-and-hold circuit (S&H) from the signal at the first terminal (Var) of the measuring oscillator ($Q_{MEAS}$). The input (yin) of the sample-and-hold circuit (S&H) is connected to the first oscillator signal ($S_{MEAS}$). During the zero crossing of the signal at the first input (Var) of the measuring oscillator ($Q_{MEAS}$) the sample-and-hold circuit thus stores the level of the first oscillator signal ($S_{MEAS}$) and outputs it as the output signal (vsh) of the sample-and-hold circuit (S&H). A setpoint value (Vsoll_amp) is deducted from this output signal (vsh) of the sample-and-hold circuit (S&H) to obtain an intermediate value signal (Vamp). This signal is multiplied by a coefficient (coeff). In the example of FIG. 10 the result is the signal (GC1) for the amplitude control of the measuring oscillator ($Q_{MEAS}$).

FIG. 11 shows an example of an amplitude control ($AC_{REF}$) for the reference oscillator ($Q_{REF}$). A comparator (comp) generates a signal for the clock input (ck) of a sample-and-hold circuit (S&H) from the signal at the second terminal (N2) of the reference oscillator ($Q_{REF}$). The input (yin) of the sample-and-hold circuit (S&H) is connected to the second oscillator signal ($S_{REF}$). During the zero crossing of the signal at the second input (N2) of the reference oscillator ($Q_{REF}$) the sample-and-hold circuit thus stores the level of the second oscillator signal ($S_{REF}$) and outputs it as the output signal (vsh) of the sample-and-hold circuit (S&H). A setpoint value (Vsoll_amp) is deducted from this output signal (vsh) of the sample-and-hold circuit (S&H) to obtain an intermediate value signal (Vamp). This signal is multiplied by a coefficient (coeff). In the example of FIG. 11 the result is the signal (GC2) for the amplitude control of the reference oscillator ($Q_{REF}$).

Another possibility of undamping would be to provide a positive further fourth resistor (R4) between the second terminal (Det) of the measuring oscillator ($Q_{MEAS}$) and the first terminal (N1) of the reference oscillator ($Q_{REF}$), respectively, and the output of the second amplifier (V2) and the output of the fifth amplifier (V5), respectively. This is illustrated in FIG. 12 using the example of the measuring oscillator ($Q_{MEAS}$).

Another possibility of undamping would be to provide another third capacitance (C3) over one of the third resistors (R3) together with a controlled positive sixth resistor (R6) connected in parallel or in series with one of the integrator capacitances. This is illustrated in FIG. 13 using the example of the reference oscillator ($Q_{REF}$).

FIGS. 10 and 11 thus show a possible implementation where the amplitude is determined by means of the zero crossing of the signal offset by 90° and is then provided to a negative resistor by means of a simple p-controller. The sample-and-hold circuit (S&H) is triggered by the start of the positive half-wave of the voltage at the first terminal (Var) of the measuring oscillator ($Q_{MEAS}$), i. e. the terminal of the capacitance ($C_{var}$) to be measured, and the start of the positive half-wave of the voltage at the second terminal (N2) of the reference oscillator ($Q_{REF}$) of the reference capacitance ($C_{ref}$), respectively, via the comparator (comp). With this trigger signal the sample-and-hold circuit (S&H) accepts the voltage level of the respective oscillator signal ($S_{MEAS}$, $S_{REF}$) applied to its input (Vin) and outputs it as its output signal (Vsh). A setpoint value (Vsoll_amp) is deducted from the output signal (Vsh) of the sample-and-hold circuit (S&H) to produce the intermediate signal (Vamp) This signal is multiplied by a predetermined factor (coeff) and used for controlling a controllable negative resistor (NR1), for example.

The capability of completely integrating the circuit allows for a frequency hopping against susceptibility to interference. Here, the resonant frequencies of the oscillators ($Q_{MEAS}$, $Q_{REF}$) are adjusted synchronously with each other. Since the frequency of the measuring oscillator ($Q_{MEAS}$) cannot exactly be defined the system frequency is the frequency of the reference oscillator ($Q_{REF}$).

The sine-wave oscillators can each be considered as bandpass which allows (interfering) signals to pass through particularly well only in the range of its vibration frequency ($f_{REF}$, $f_{MEAS}$). This results in an intrinsic sensitivity around the respective measured vibration frequency ($f_{REF}$, $f_{MEAS}$). The resonant circuit then "snaps" onto the interfering frequency when the interfering amplitude becomes larger at the internal reference voltage grid (dotted line SA of FIG. 14) than the desired useful amplitude (solid line NA of FIG. 7). FIG. 14 shows this sensitivity curve of the oscillator circuits (y-axis) as a function of the interfering frequency ($f_s$) (x-axis).

It should be appreciated that in a relatively large range within the sensitive band the interference can be recognized after all. In the A-range (approximate representation) the interference leads to the amplitude control leaving its operating range, and this can be indicted by means of the circuit. Only in the B-range is the measuring signal strongly changed (snapped onto the interfering frequency) but an interference cannot be directly detected.

The following frequency hopping method illustrated in FIG. 15 avoids these problems:

The system frequency of the oscillators ($Q_{MEAS}$, $Q_{REF}$) is designed such that it is adapted to be changed. This can be realized by the capability of changing any one of the second capacitance (C2) and/or the first resistors (R1) and/or the second resistors (R2). Arrays of these components having multiplexers for switchover purposes are suitable, for example.

The change of the output frequency ($f_{REF}$, $f_{MEAS}$) of the oscillator signals ($S_{REF}$, $S_{MEAS}$) of the oscillators ($Q_{MEAS}$, $Q_{REF}$) is easiest to be carried out by switching over their respective first resistors (R1) and/or second resistors (R2) for changing the values of these resistors. Preferably, the values of the resistors (R1, R2) are switched over in the same manner in the reference oscillator ($Q_{REF}$) and in the measuring oscillator ($Q_{MEAS}$). This switchover is preferably carried out by a switchover control.

In a measuring cycle two frequencies ($f_{REF1}$, $f_{REF2}$) lying close to each other are alternately used as the first system frequency ($f_{REF1}$) and the second system frequency ($f_{REF2}$). Preferably, the frequency amount of the first system frequency ($f_{REF1}$) differs from the frequency amount of the second system frequency ($f_{REF2}$), by less than 20%, more preferably by less than 10%, more preferably by less than 5%, more preferably by less than 3%. For this purpose, the respective first resistor (R1) of the oscillators ($Q_{MEAS}$, $Q_{REF}$) is changed in the same manner to a small extent only. At the first system frequency ($f_{REF1}$) it assumes a first resistance and at the second system frequency ($f_{REF2}$) it assumes a second resistance. Here, hardly any loss of measuring time occurs since the mean value of the two measurements can be used at the first system frequency ($f_{REF1}$) and at the second system frequency ($f_{REF2}$).

Here, the two system frequencies ($f_{REF1}$, $f_{REF2}$) of the output signal ($S_{REF}$) of the reference oscillator ($Q_{REF}$) destined for normal operation are selected such that the B-range of the output signal ($S_{REF}$) of the reference oscillator ($Q_{REF}$) at the first system frequency ($f_{REF1}$) of the second oscillator signal ($S_{REF}$) of the reference oscillator ($Q_{REF}$) and the B-range of the second oscillator signal ($S_{REF}$) of the reference oscillator ($Q_{REF}$) at the second system frequency ($f_{REF2}$) of the second oscillator signal ($S_{REF}$) of the reference oscillator ($Q_{REF}$) do not overlap each other.

Thereby an interference can be recognized in any case.

Either one of the vibrations is in the A-range which leads to a saturation of the amplitude control and can be recognized by a threshold value being exceeded, or an interference occurs in the C-range and one occurs in the B-range which indicates different measuring results of the two measurements.

In the case of such an interference a third measurement is carried out at a third system frequency ($f_{REF3}$) of the second oscillator signal ($S_{REF}$) of the reference oscillator ($Q_{REF}$) at a slower or faster third system frequency ($f_{REF3}$), having a frequency amount preferably smaller by a factor of 5 as compared with the first system frequency ($f_{REF1}$) the backup frequency. The reason why the backup frequency ($f_{REF3}$) is used only in the case of an interference is that the circuit having a 5 times smaller frequency does possibly no longer reach the full performance.

Thus, this disclosure proposes an apparatus (apparatus A) for measuring the capacitance ($C_{var}$) to be measured. It comprises a first sine-wave oscillator, the measuring oscillator ($Q_{MEAS}$), and a second sine-wave oscillator, the reference oscillator ($Q_{REF}$). The frequency ($f_{MEAS}$) of the output signal ($S_{MEAS}$) of the measuring oscillator ($Q_{MEAS}$) is dependent on the capacitance ($C_{var}$) to be measured. In contrast, the frequency ($f_{REF}$) of the output signal ($S_{REF}$) of the reference oscillator ($Q_{REF}$) is dependent on a reference capacitance ($C_{ref}$). A sub-apparatus which produces the ratio of the frequency value of the frequency REF, ($f_{REF}$) of the output signal ($S_{REF}$) of the reference oscillator ($Q_{REF}$) and the frequency value of the frequency ($f_{MEAS}$) of the output signal ($S_{MEAS}$) of the measuring oscillator ($Q_{MEAS}$) and subsequently squares this ratio provides the actual measured value (Out) for the capacitance ($C_{var}$) to be measured which it determines from the frequency value of the frequency ($f_{REF}$) of the output signal ($S_{REF}$) of the reference oscillator ($Q_{REF}$) and the frequency value of the frequency ($f_{MEAS}$) of the output signal ($S_{MEAS}$).

The two sine-wave oscillators ($Q_{MEAS}$, $Q_{REF}$) are of identical configuration except for the measuring capacitance ($C_{var}$) and the reference capacitance ($C_{ref}$).

According another aspect, a proposed apparatus is suited for measuring the quotient of two capacitances ($C_{var1}$, $C_{var2}$) to be measured. It comprises a first sine-wave oscillator, the measuring oscillator ($Q_{MEAS}$), and a second sine-wave oscillator, the reference oscillator ($Q_{REF}$). The frequency ($f_{MEAS}$) of the output signal ($S_{MEAS}$) of the measuring oscillator ($Q_{MEAS}$) is dependent on the quotient of the two capacitances ($C_{var1}$, $C_{var2}$) to be measured. In this variant, the frequency ($f_{REF}$) of the output signal ($S_{REF}$) of the reference oscillator ($Q_{REF}$) is dependent on the quotient of the two capacitances ($C_{ref1}$, $C_{ref2}$). This second variant for measuring an unknown capacitance ratio comprises a different sub-apparatus which produces the ratio of the frequency value of the frequency ($f_{REF}$) of the output signal ($S_{REF}$) of the reference oscillator ($Q_{REF}$) and the frequency value of the frequency ($f_{MEAS}$) of the output signal ($S_{MEAS}$) of the measuring oscillator ($Q_{MEAS}$) and subsequently squares this ratio to provide a measured value (Out) for a quotient of the two capacitances ($C_{var1}$, $C_{var2}$) to be measured. Here, too, the two sine-wave oscillators ($Q_{MEAS}$, $Q_{REF}$) should be of identical configuration except for the two measuring capacitances ($C_{var1}$, $C_{var2}$) and the reference capacitances ($C_{ref1}$, $C_{ref2}$).

For avoiding overdriving, it is appropriate when the reference capacitance ($C_{ref}$) corresponds to the mean measuring capacitance ($C_{var}$). The reason for this is that in many measuring circuits the temporal course of a capacitance is to be determined. For maximizing the signal range this condition should therefore be fulfilled over the temporal course. Typically, the reference capacitance ($C_{ref}$) might thus be selected in the center of the provided tolerance range with regard to its capacitance.

For optimizing the matching the two sine-wave oscillators ($Q_{MEAS}$, $Q_{REF}$) in the integrated microelectronic circuit (IC) are preferably of an identical configuration except for the two measuring capacitances ($C_{var}$) and the reference capacitance ($C_{ref}$). Preferably, the two layouts are scrambled. Here, the parasitic couplings must be taken into account. For this purpose, the component parts of the two sine-wave oscillators ($Q_{MEAS}$, $Q_{REF}$) are selected to be identical, identically placed and identically aligned. The measuring oscillator ($Q_{MEAS}$) again comprises an output signal ($S_{MEAS}$) and the reference oscillator ($Q_{REF}$) comprises an output signal ($S_{REF}$). The measuring oscillator ($Q_{MEAS}$) comprises a first amplifier (V1), a second amplifier (V2) and a third amplifier (V3). The first amplifier (V1) is interconnected with a first resistor (R1) and the capacitance ($C_{var}$), whose capacitance is to be determined in the case of the measuring oscillator ($Q_{MEAS}$), to form a first integrating amplifier. The second amplifier (V2) is interconnected to form an inverting amplifier. The third amplifier (V3) is interconnected with a second capacitance (C2) and a second resistor (R2) to form a second integrating amplifier. The first integrating amplifier and the second integrating amplifier and the inverting amplifier are interconnected in series in a circle to form an oscillator ring (ring). They thus form a ring oscillator through which a ring signal passes. At one location of this ring the ring signal is tapped as an output signal ($S_{MEAS}$) of the measuring oscillator ($Q_{MEAS}$). The reference oscillator ($Q_{REF}$) is set up analogously to always provide a good frequency normal. It comprises a fourth amplifier (V4), a fifth amplifier (V5) and a sixth amplifier (V6). Analogously to the circuit of the measuring oscillator ($Q_{MEAS}$), the fourth amplifier (V4) is interconnected with a first resistor (R1) and the reference capacitance ($C_{ref}$) to form a first integrating amplifier. Here, the first resistor represents a resistor type and not a real component part. The first resistor (R1) of the reference oscillator ($Q_{REF}$) is thus to be considered as a component part which preferably has the same size, layout, alignment, resistance and configuration as the first resistor (R1) of the measuring oscillator ($Q_{MEAS}$). Likewise, hereinafter a second resistor (R2) of the reference oscillator ($Q_{REF}$) is to be considered as a component part which preferably has the same size, layout, alignment, resistance and configuration as a second resistor (R2) of the measuring oscillator ($Q_{MEAS}$). In addition, hereinafter a third resistor (R3) of the reference oscillator ($Q_{REF}$) is to be considered as a component part which preferably has the same size, layout, alignment, resistance and configuration as a third resistor (R3) of the measuring oscillator ($Q_{MEAS}$). In case of the reference oscillator ($Q_{REF}$), analogously to the measuring oscillator ($Q_{MEAS}$) the fifth amplifier (V5) is interconnected to form an inverting amplifier. Therefore, the sixth amplifier (V6) is interconnected with a second capacitance (C2) and a second resistor (R2) to form a second integrating amplifier. The first integrating amplifier and the second integrating amplifier and the inverting amplifier are connected in series to form a ring oscillator. As in the case of the measuring oscillator, this ring of the ring oscillator generates a circulating ring signal. At a location of this ring of the reference oscillator ($Q_{REF}$), the ring signal is tapped as the output signal ($S_{REF}$) of the reference oscillator ($Q_{REF}$).

Preferably, sine-wave oscillators ($Q_{MEAS}$, $Q_{REF}$), the reference oscillator ($Q_{REF}$) and the measuring oscillator ($Q_{MEAS}$), are state-variable oscillators.

Preferably, the sub-apparatus comprises a first analog-to-digital converter (INV1) which converts the first oscillator signal ($S_{MEAS}$) into a first digital or binary data flow (ds1) and a second analog-to-digital converter (INV2) which converts the second oscillator signal ($S_{REF}$) into a second digital or binary data flow (ds2). In addition, in this variant the sub-apparatus comprises a high-frequency oscillator (HF-OSC) which generates high-frequency counting pulses. A first high-frequency pulse counter (CNT1) counts the number of high-frequency counting pulses of the high-frequency oscillator (HF-OSC) as a function of the signal of the first digital or binary data flow (ds1) for determining a first counting result. A second high-frequency pulse counter (CNT2) counts the number of high-frequency counting pulses of the high-frequency oscillator (HF-OSC) as a function of the signal of the second digital or binary data flow (ds2) for determining a second counting result. A division block (/) divides the first counting result by the second counting result to obtain a division result. A squaring apparatus (^2) squares the division result to provide the measured value (Out).

Preferably, the two sine-wave oscillators ($Q_{MEAS}$, $Q_{REF}$) include a control of the respective amplitude of a signal available at the capacitance ($C_{var}$) to be measured and the reference capacitance ($C_{ref}$), respectively. This offers the advantage that parasitic elements do not substantially contribute to the determination of the real frequency as in the case of a saturation restriction of the sine-wave oscillators.

Overdriving of the control of this amplitude can be utilized for recognizing external interference sources. In doing so, a control signal for the amplitude control or an amplitude value signal which reflects the amplitude at an output of the respective sine-wave oscillator, i. e. the first oscillator signal ($S_{MEAS}$) or the second oscillator signal ($S_{REF}$), is preferably compared with at least an amplitude threshold value and at least a control signal threshold value, respectively, by a comparator. In this disclosure, in the case of such a control signal which can be monitored by a first monitoring comparator with regard to exceeding an upper control signal threshold value or by a second monitoring comparator with regard to falling below a lower control signal threshold value, this may be the amplitude control (GC1) of the measuring oscillator ($Q_{MEAS}$) or the amplitude control (GC2) of the reference oscillator ($Q_{REF}$), for example. If the amplitude exceeds the upper amplitude threshold value or if the control signal exceeds the corresponding upper control signal threshold value an error has occurred which can be indicated by a control of the apparatus. This indication can be performed via a line or by providing error data in a data register of the integrated circuit (IC). The two sine-wave oscillators ($Q_{MEAS}$, $Q_{REF}$) preferably form part of this integrated circuit (IC). This information can then be retrieved via an optional data interface, for example.

The respective amplitude of the two sine-wave oscillators ($Q_{MEAS}$, $Q_{REF}$) is preferably determined for the amplitude control at their respective output, i.e. their respective oscillator signal ($S_{MEAS}$, $S_{REF}$), by voltage measurement exactly when the voltage at the first terminal (Var) of the measuring oscillator ($Q_{MEAS}$) and at the second terminal (N2) of the reference oscillator ($Q_{REF}$), respectively, experiences a zero crossing. Namely, when the voltage at the first terminal (Var) of the measuring oscillator ($Q_{MEAS}$) and the second terminal (N2) of the reference oscillator ($Q_{REF}$), respectively, experiences a zero crossing, the amplitude of the respective output of the sine-wave oscillators ($Q_{MEAS}$, $Q_{REF}$), i. e. their respective oscillator signal ($S_{MEAS}$, $S_{REF}$), always reaches its maximum, that is at this moment the amplitude can be determined with a small error simply by an unsophisticated sample-and-hold circuit (S&H). Thus, only the zero crossing of the vibration must be correctly determined, which is realized by the comparator (comp) in the proposed apparatus. Preferably, the measurement of the amplitude at these points is thus carried out at the zero crossing of another signal (Var, N2) of the respective sine-wave oscillator ($Q_{MEAS}$, $Q_{REF}$), which preferably is phase-shifted by 90° with respect to its temporal phase position as compared with the signal available at the capacitance ($C_{var}$) to be measured at the measuring oscillator ($Q_{MEAS}$) and the reference capacitance ($C_{REF}$) at the reference oscillator ($Q_{REF}$), respectively.

For a preferred actuation for the amplitude control of the sine-wave oscillators ($Q_{MEAS}$, $Q_{REF}$) an adjustable amplification is used. According to a preferred variant, the control of the amplitude is performed by the respective adjustment of a respective additional negative parallel resistor (NR1) to the capacitance ($C_{var}$) to be measured in the measuring oscillator ($Q_{MEAS}$) and the reference capacitance ($C_{ref}$) in the reference oscillator ($Q_{REF}$), respectively, i.e., in the respective sine-wave oscillator ($Q_{MEAS}$, $Q_{REF}$).

The resistors of the sine-wave oscillators ($Q_{MEAS}$, $Q_{REF}$) can be configured such that they are adapted to be electronically modified. This can be carried out in an analog but also in a digital manner by a step-by-step switchover. Typically, this modification is carried out as a function of a frequency control signal which may be an analog, digital or binary signal. In doing so, a common frequency control signal preferably controls the reference oscillator ($Q_{REF}$) and the measuring oscillator ($Q_{MEAS}$) typically in the same manner. Thereby a frequency modulation during the measurement is possible.

This frequency modulation can be used for changing the frequency spectrum of the oscillator signal ($S_{REF}$, $S_{MEAS}$) on the one hand such that it does not overlap or only overlap to a small extent with any existing sources of interference. On the other hand, properties depending on the measuring frequency of the capacitance ($C_{var}$) to be measured are easier to determine.

Thus, the proposed apparatus can not only determine the capacitance of the main capacitance at one frequency but also allow for determination of further parameter values of further elements of a substitute circuit diagram of the capacitance ($C_{var}$) to be measured by means of further measured frequency values. If capacitive sensors are measured, the series inductance and a parallel conductance to the capacitance etc. can be measured, for example. This is in particular of interest when these parameters are dependent on the temperature in a known manner. Therefore, it is possible to draw a conclusion with regard to the temperature of the capacitance ($C_{var}$) to be measured. The apparatus can thus be configured or destined for determining further additional parameter values with regard to the capacitance ($C_{var}$) to be measured with the aid of this plurality of measured values, wherein the apparatus may comprise apparatus systems, in particular a computer system, which determine and indicate or provide the capacitance ($C_{var}$) to be measured and further parameter values from these measuring results.

Typically, the reference frequency ($f_{REF}$) of the second oscillator signal ($S_{REF}$), which represents the output of the reference oscillator ($Q_{REF}$), is relatively fixedly predetermined by the design. It is therefore reasonable to design the apparatus such that it can be operated at more than one reference frequency ($f_{REF1}$, $f_{REF2}$, $f_{REF3}$) of the second oscillator signal ($f_{REF}$) which is the output signal of the reference oscillator ($Q_{REF}$). This corresponds to a configuration of the apparatus which allows for operating at more than one measuring frequency ($f_{MEAS1}$, $f_{MEAS2}$, $f_{MEAS3}$) of the first oscillator signal ($f_{MEAS}$) which is the output signal of the measuring oscillator ($Q_{MEAS}$). Normally this is always done for the purpose of determining more than one measuring result. However, a plurality of intermediate measuring results may be combined to produce one measuring result such that only one measuring result is determined. Preferably, the apparatus is configured to compare these measuring results and to recognize and indicate an interference of the measurement when the respective measuring results are not plausible or deviate from predetermined or computed set-point values for these measured values within a tolerance band.

Preferably, the frequency ($f_{MEAS}$, $f_{REF}$) of the output signals ($S_{REF}$, $S_{MEAS}$) of the sine-wave oscillators ($Q_{MEAS}$, $Q_{REF}$) is dependent on resistors (R1, R2) in these sine-wave oscillators ($Q_{MEAS}$, $Q_{REF}$). The measuring oscillator ($Q_{MEAS}$) comprises these resistors (R1, R2) and the reference oscillator ($Q_{REF}$) comprises these resistors (R1, R2) of the same configuration. At least one of these resistors (R1, R2) in the two sine-wave oscillators ($Q_{MEAS}$, $Q_{REF}$) is adapted to be switched over or changed in the same manner with respect to these two sine-wave oscillators ($Q_{MEAS}$, $Q_{REF}$), which offers the advantages of the possibility of frequency modulation as described above.

In the simplest case of a frequency modulation the apparatus is configured to determine a first and a second measuring result at a first reference frequency ($f_{REF1}$) and a second reference frequency ($f_{REF2}$), wherein the first reference frequency ($f_{REF1}$) is selected with such a frequency spacing to the second reference frequency ($f_{REF2}$) that their frequency amounts do not differ from each other by more than 20% and/or more than 10% and/or more than 5% and/or more than 3%. This means a corresponding response of the measuring frequencies. In the simplest case of a frequency modulation the apparatus is configured to determine a first and a second measuring result at a first measuring frequency ($f_{MEAS1}$) and a second measuring frequency ($f_{MEAS2}$), wherein the first measuring frequency ($f_{MEAS1}$) is selected with such a frequency spacing to the second measuring frequency ($f_{MEAS2}$) that their frequency amounts do not differ from each other by more than 20% and/or more than 10% and/or more than 5% and/or more than 3%. However, since the measuring frequency is dependent on the capacitance ($C_{var}$) to be measured normally the reference frequency ($f_{REF}$) is adjusted.

The different measured values can now be used for recognizing an interference caused by an interference signal introduced from outside by EMC, for example, and for switching to a third reference frequency ($f_{REF3}$) and thus a third measuring frequency ($f_{MEAS3}$). It has been recognized that in many cases of application it is reasonable to switch over to a third frequency ($f_{REF3}$) whose amount is higher or lower by a factor between 4 and 6, preferably 5, as compared with the first reference frequency ($f_{REF1}$) when such an interference is recognized and/or to switch over to a third measuring frequency ($f_{MEAS3}$) whose amount is higher or lower by a factor between 4 and 6, preferably 5, as compared with the first measuring frequency ($f_{MEAS1}$) when such an interference is recognized.

Advantage of the Invention

Hereinafter various advantageous aspects of the proposed apparatus are discussed. However, the advantages are not limited to these advantages.

Susceptibility to Interference

As has already been stated, the oscillators ($Q_{MEAS}$, $Q_{REF}$) can be considered as bandpass which allows (interfering) signals to pass through particularly well only in the range of its vibration frequency. An exemplary vibration frequency of 250 MHz resulted in a sensitivity in the range of 183 kHz to 340 kHz in an exemplary interference model.

First advantage: Interferences in the frequency range which is smaller than 1 MHz are often easier to manage than those in the high MHz range.

Frequency hopping offers a possibility of avoiding interferences which occur in the sensitive range. Thus a consistent interference immunity is possible as long as the source of interference does not by chance contain two unfavorable frequencies at a time.

On the other hand, SC circuits have a narrower band but are sensitive at multiples of their switching frequency; the circuit principle allows for a damping only as from approximately a factor 20 of the switching frequency since the signal must be quick enough to stabilize within half a clock. An SC circuit operating at 500 kHz is thus very sensitive up to far into the 10 MHz range without it being possible to take any countermeasures. In SC circuits the frequency can also be switched over, however, an interference can principally be recognized only by a comparison measurement at two frequencies. In the case of the oscillator principle this is in most cases also possible via the amplitude control saturation (range A). When an interference is recognized it is not known which one of the harmonics is subjected to interference. The possible interference lies within a very large range, e. g. 250 kHz to 10 MHz. There exists no reliable back-up frequency which in no case is subjected to interference.

As compared with other resonant oscillator methods the advantage is that no external coil is necessary and no dependence on chip-internal resistors exists. Further, a frequency hopping and a frequency modulation are possible.

The invention can further be utilized to measure other component parts than capacitances, which component parts form integral part of the sine-wave oscillators which should be of identical configuration, if possible (e. g. for measuring ohmic resistances). In this case the capacitances of the two sine-wave oscillators are the same and their resistors $R_1$ (or $R_2$) upon which the vibration frequencies depend as per the above formula are different. Consequently, one of the resistors $R_1$ (or $R_2$) is the resistor to be measured while the other one is the known reference resistor.

Further, the invention can be utilized to measure a frequency-dependent change of the parameters at the component parts.

LIST OF THE FIGURES

Figure 1:
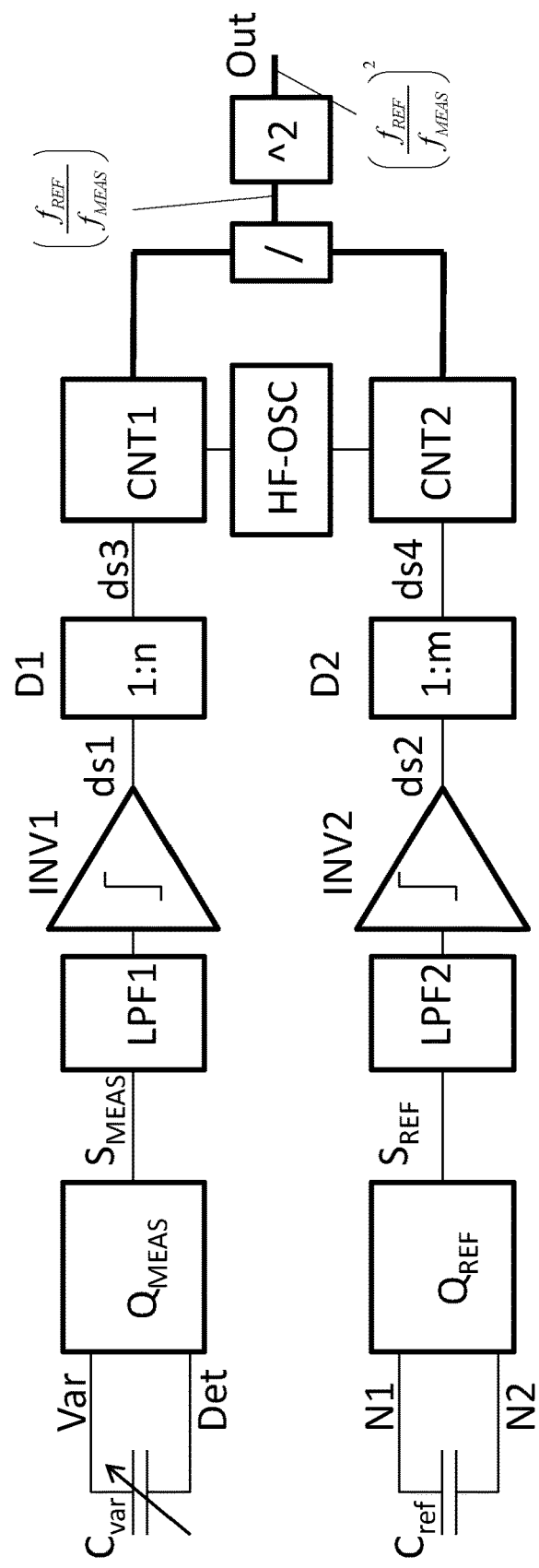
FIG. 1 shows a schematic simplified view of the proposed apparatus for determining the capacitance ($C_{var}$) to be measured.
Figure 2:
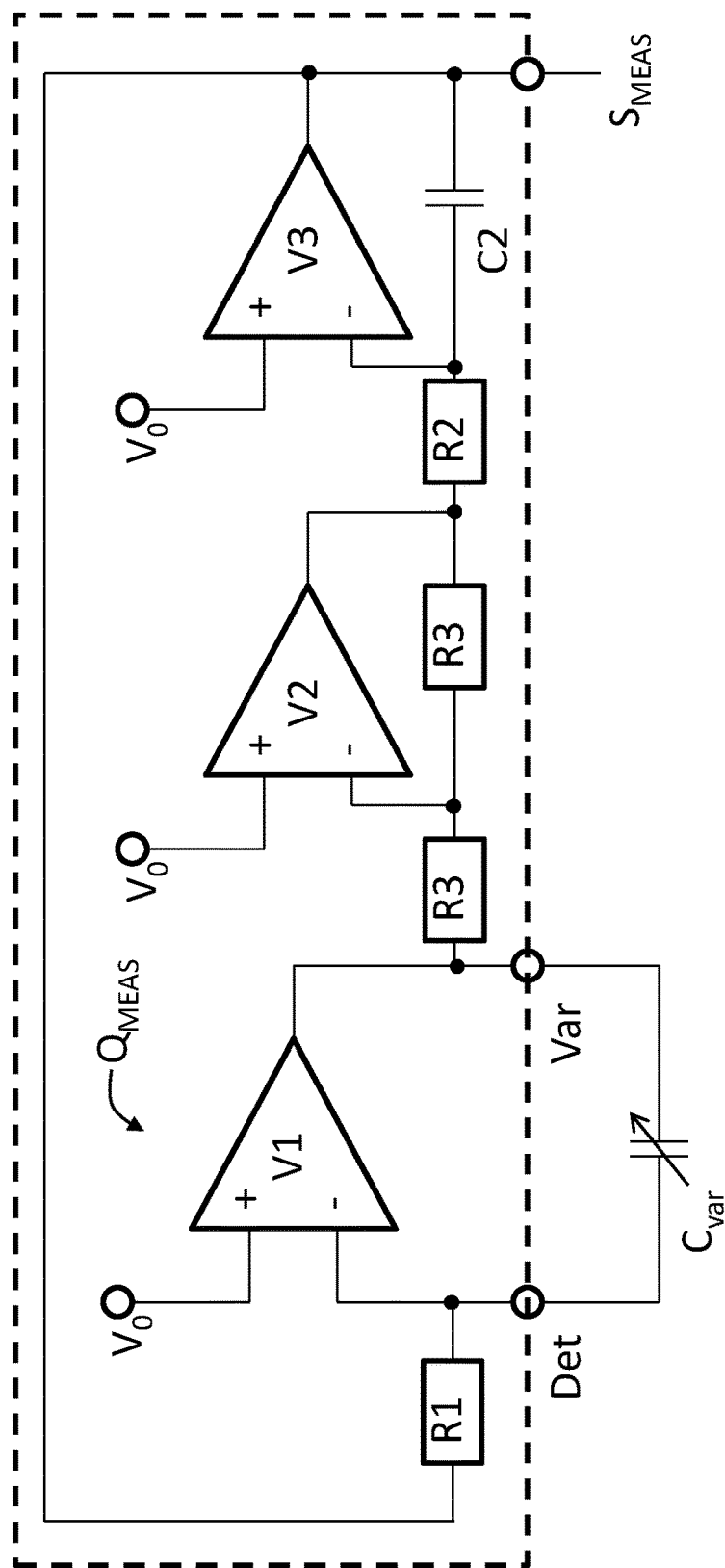
FIG. 2 shows a schematic simplified view of a suitable sine-wave oscillator as a measuring oscillator ($Q_{MEAS}$).
Figure 3:
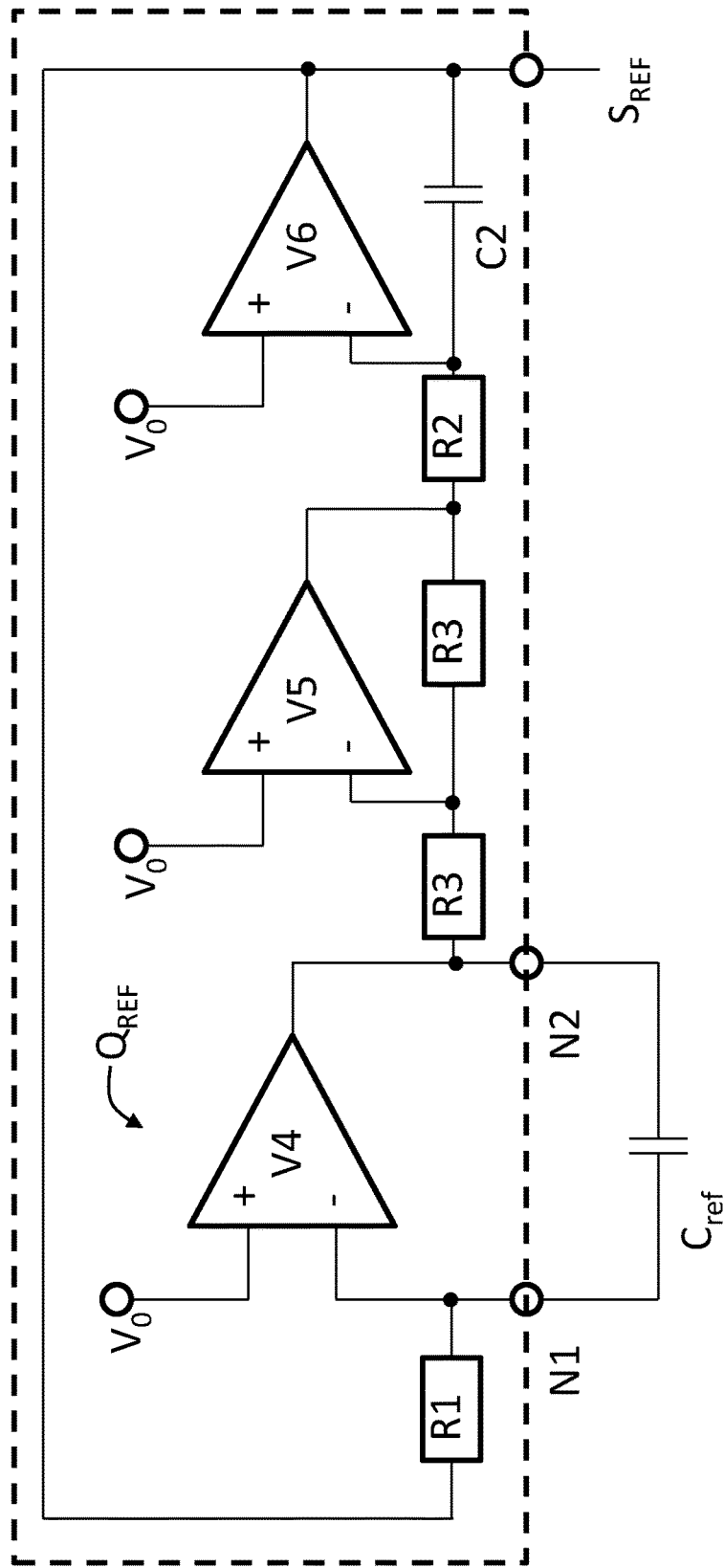
FIG. 3 shows a schematic simplified view of a suitable sine-wave oscillator as a reference oscillator ($Q_{REF}$).
Figure 4:
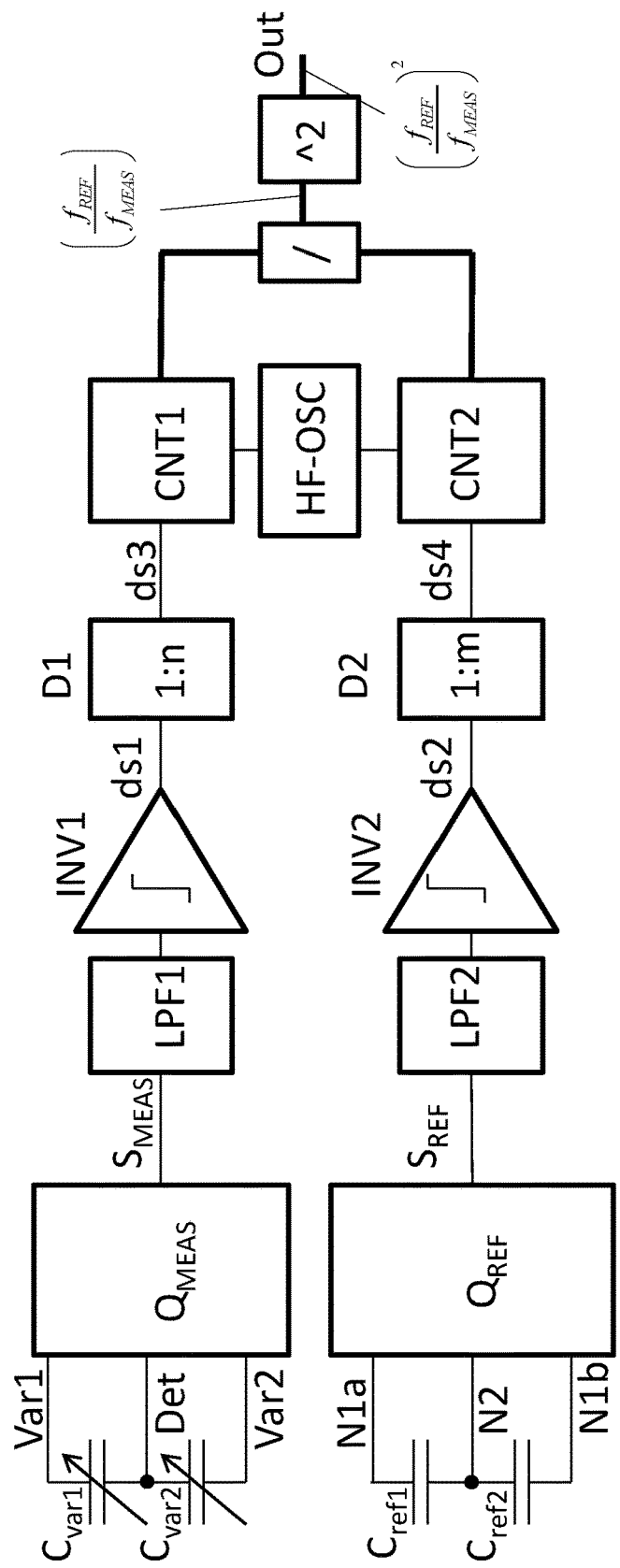
FIG. 4 shows a schematic simplified view of the proposed apparatus for determining the capacitance ratio of a pair of capacitances ($C_{var1}$, $C_{var2}$) to be measured.
Figure 5:
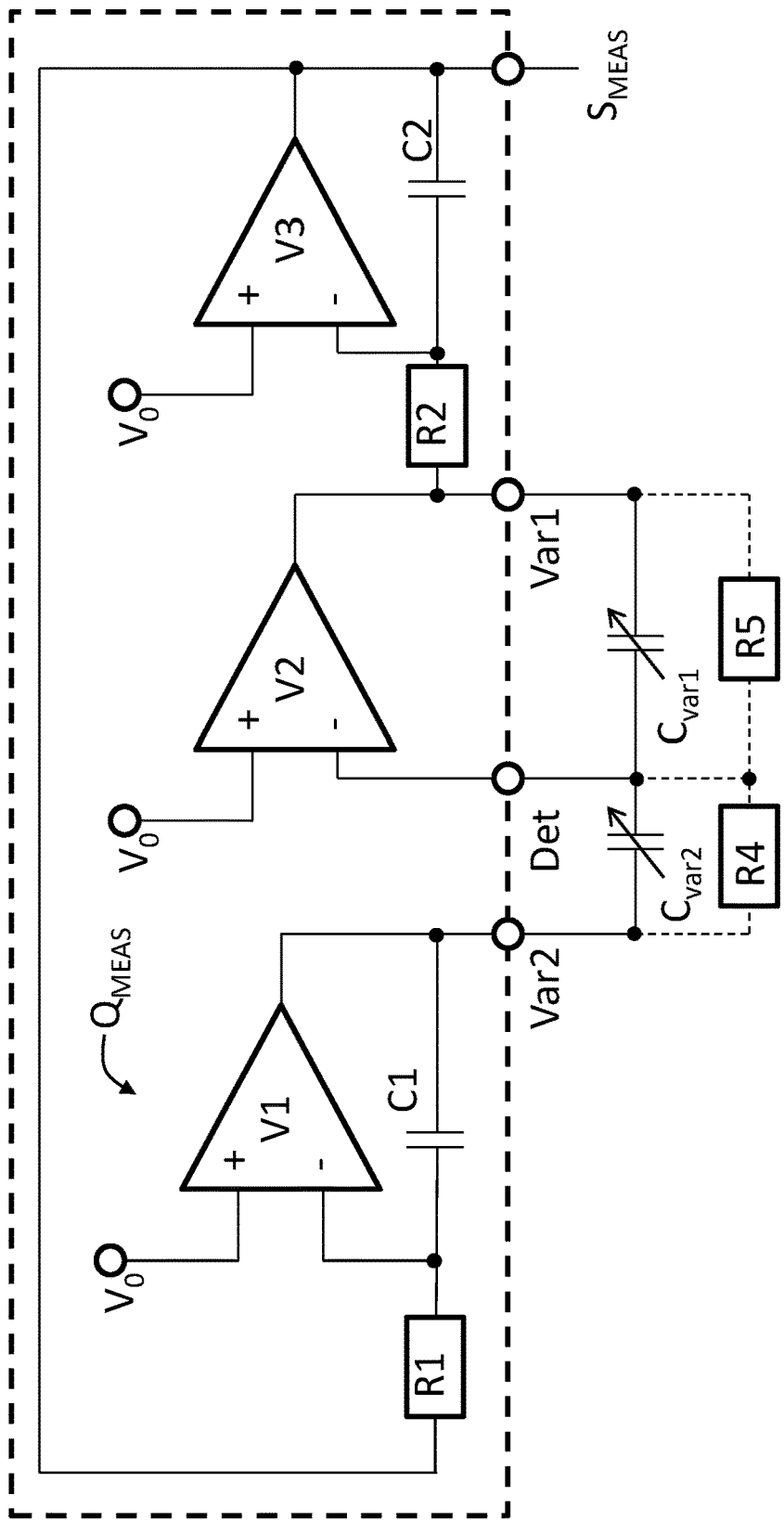
FIG. 5 shows a schematic simplified view of a suitable sine-wave oscillator ($Q_{MEAS}$) matching FIG. 4.
Figure 6:
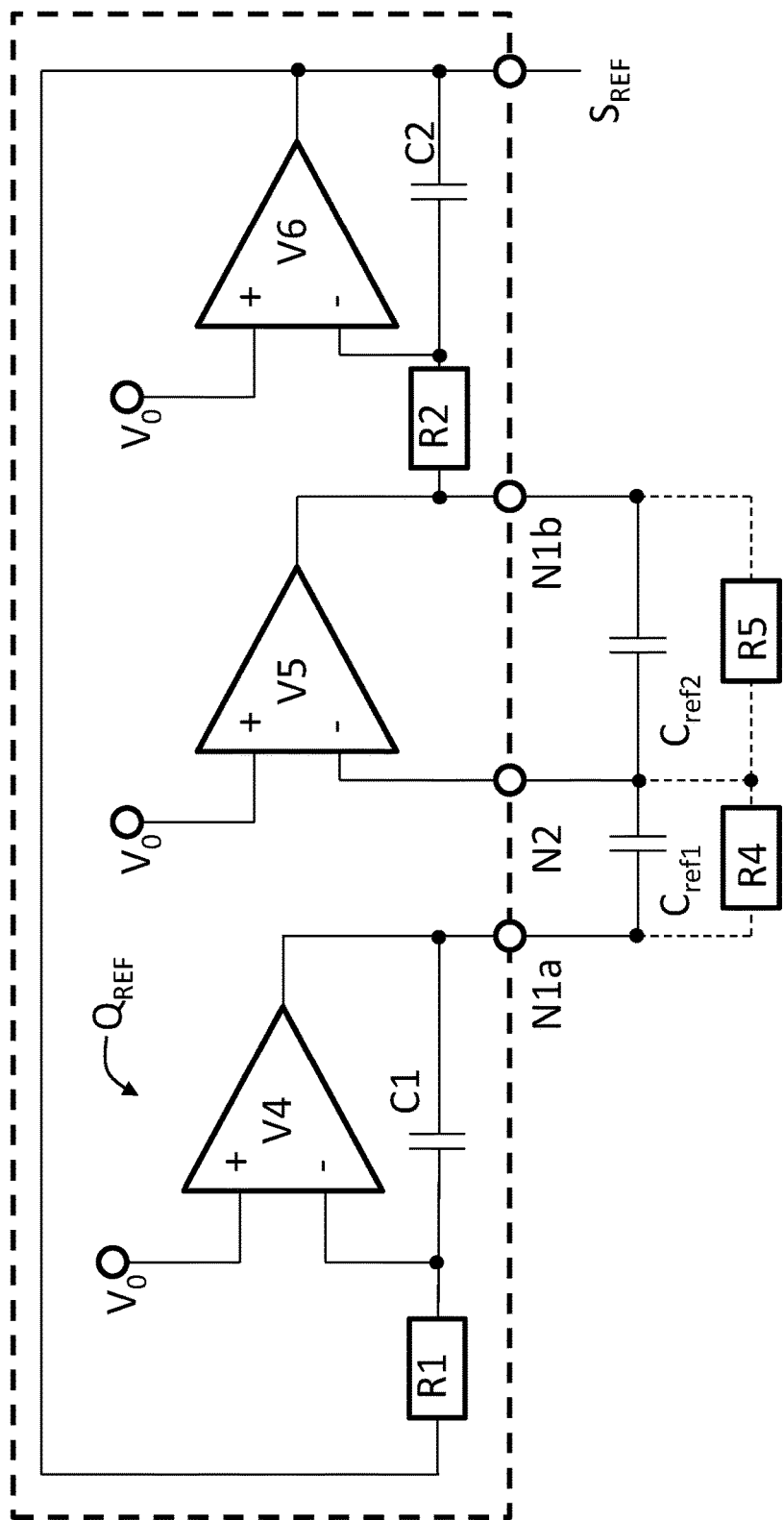
FIG. 6 shows a schematic simplified view of a suitable sine-wave oscillator ($Q_{REF}$) matching FIG. 4.
Figure 7:
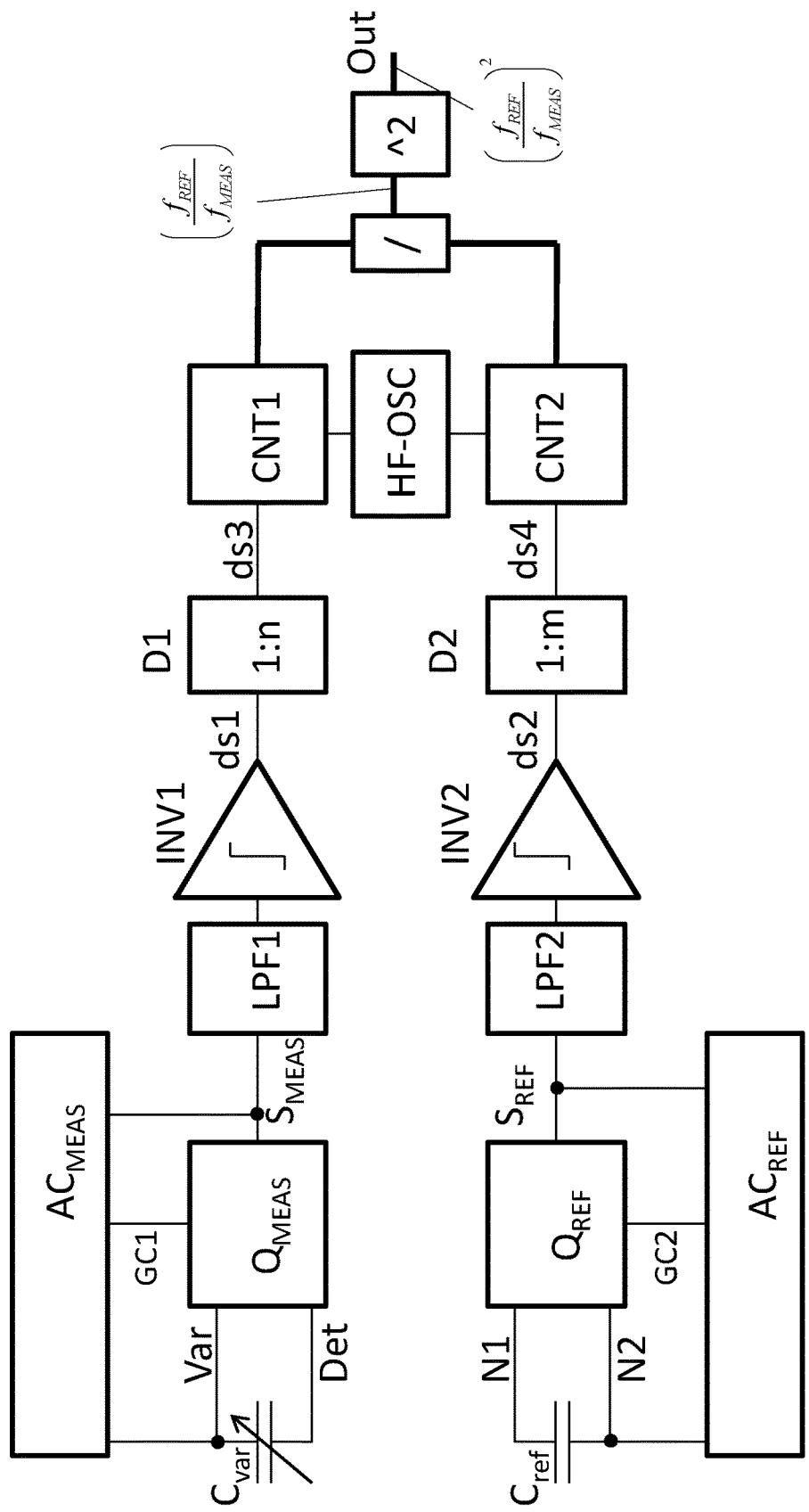

FIG. 7 corresponds to FIG. 1 with additional amplitude controls ($AC_{REF}$, $AC_{MEAS}$).

Figure 8:
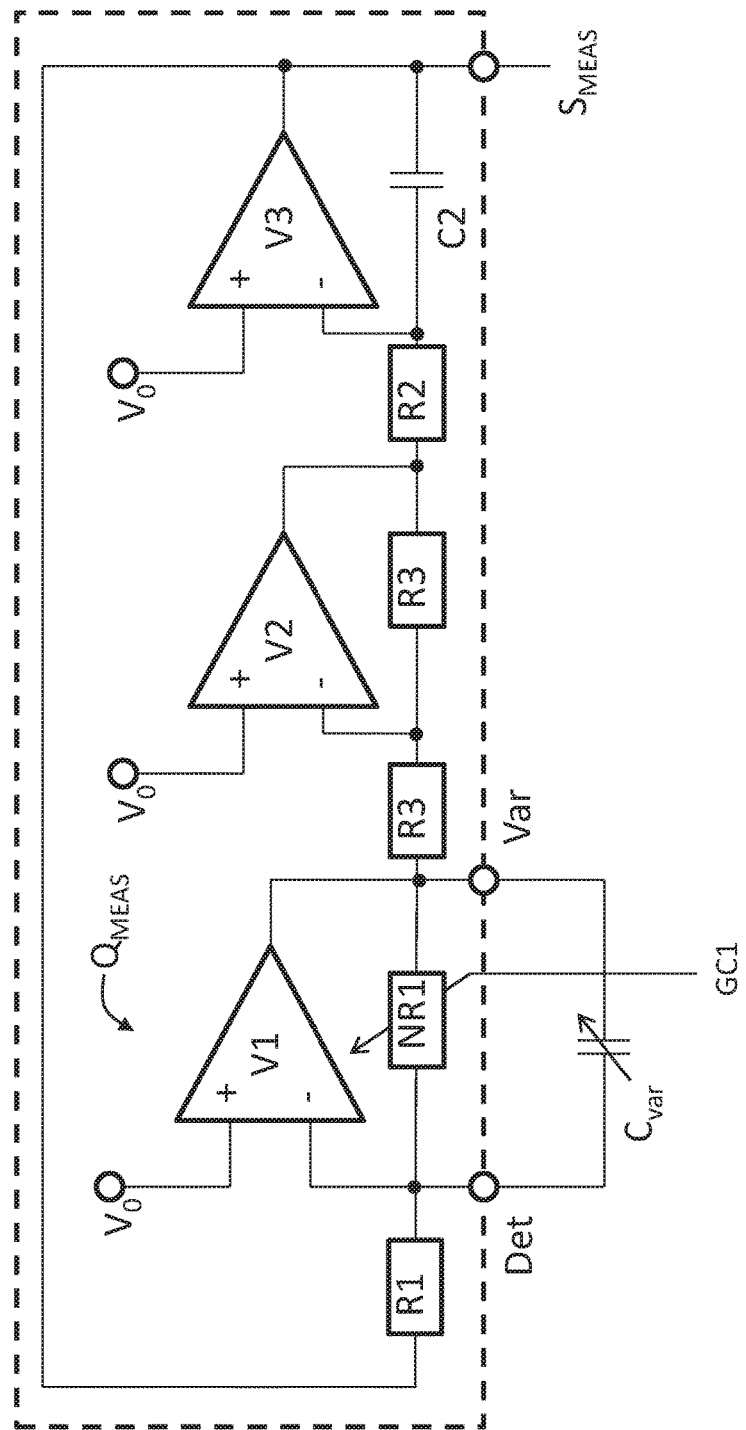

FIG. 8 shows a schematic simplified view of a suitable measuring oscillator ($Q_{MEAS}$) matching FIG. 7 as an example of a possible amplitude-controllable sine-wave oscillator.

Figure 9:
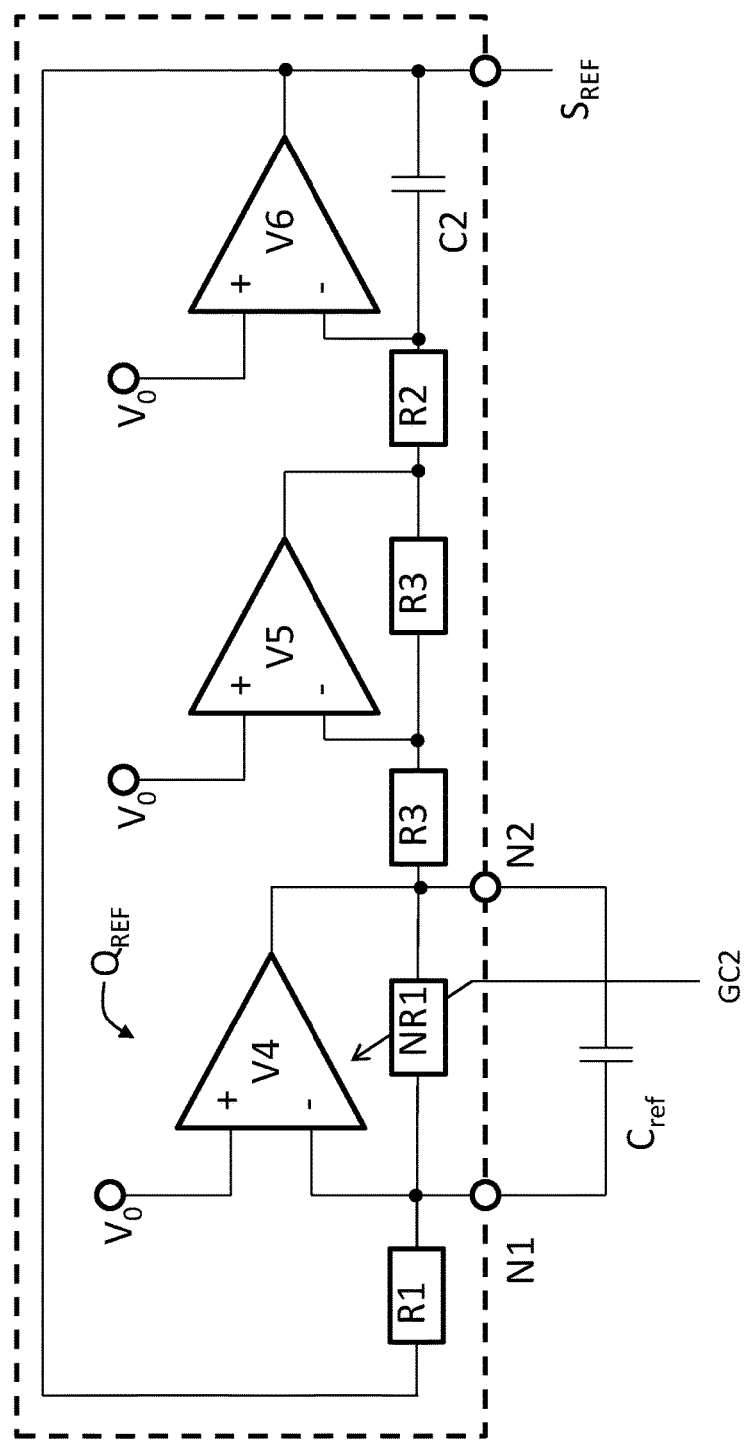

FIG. 9 shows a schematic simplified view of a suitable reference oscillator ($Q_{REF}$) matching FIG. 7 as an example of a possible amplitude-controllable sine-wave oscillator.

Figure 10:
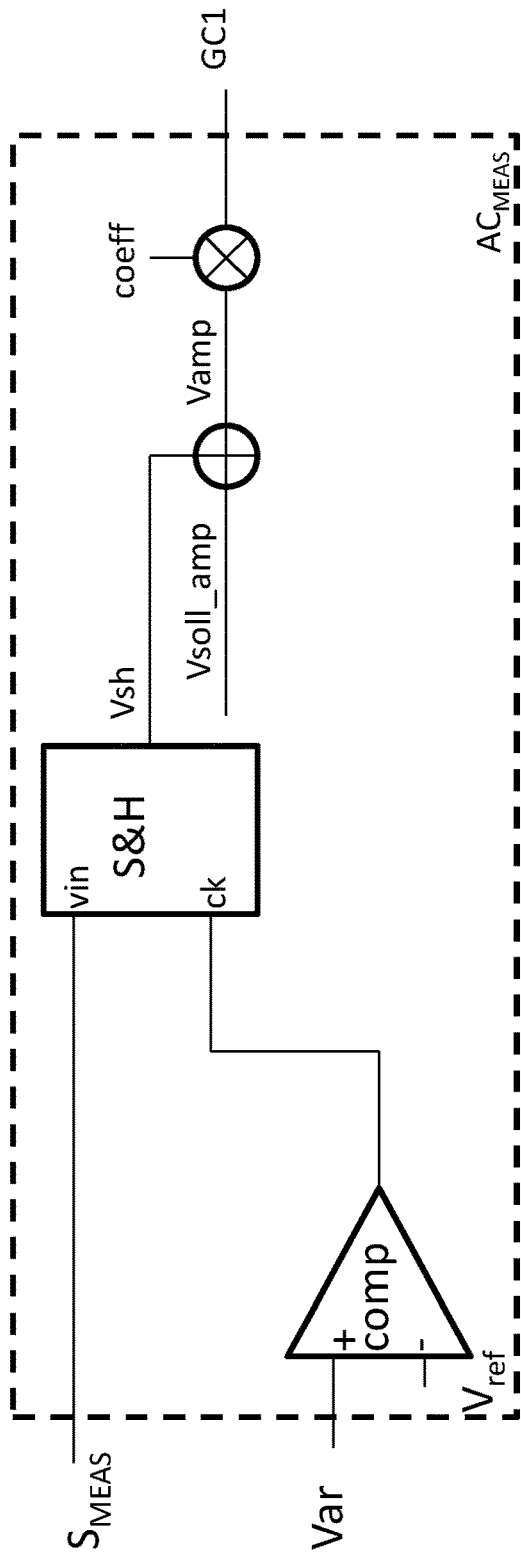

FIG. 10 shows a suitable amplitude control ($AC_{MEAS}$) for the measuring oscillator ($Q_{MEAS}$) corresponding to FIG. 7.

Figure 11:
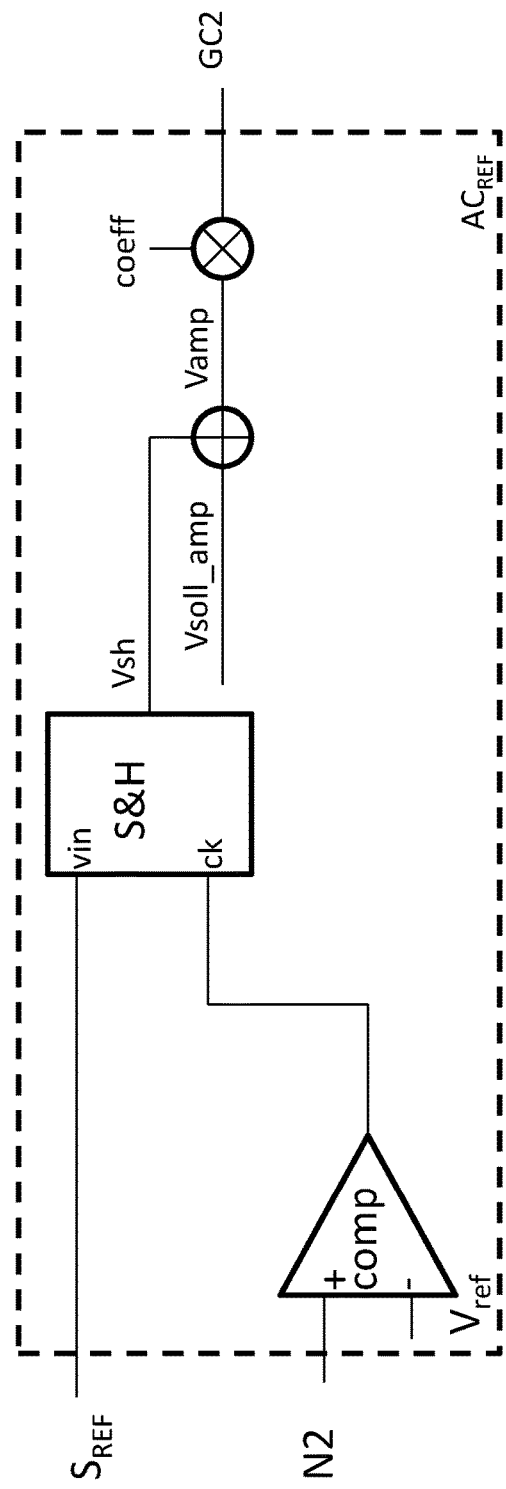

FIG. 11 shows a suitable amplitude control ($AC_{REF}$) for the reference oscillator ($Q_{REF}$) corresponding to FIG. 7.

Figure 12:
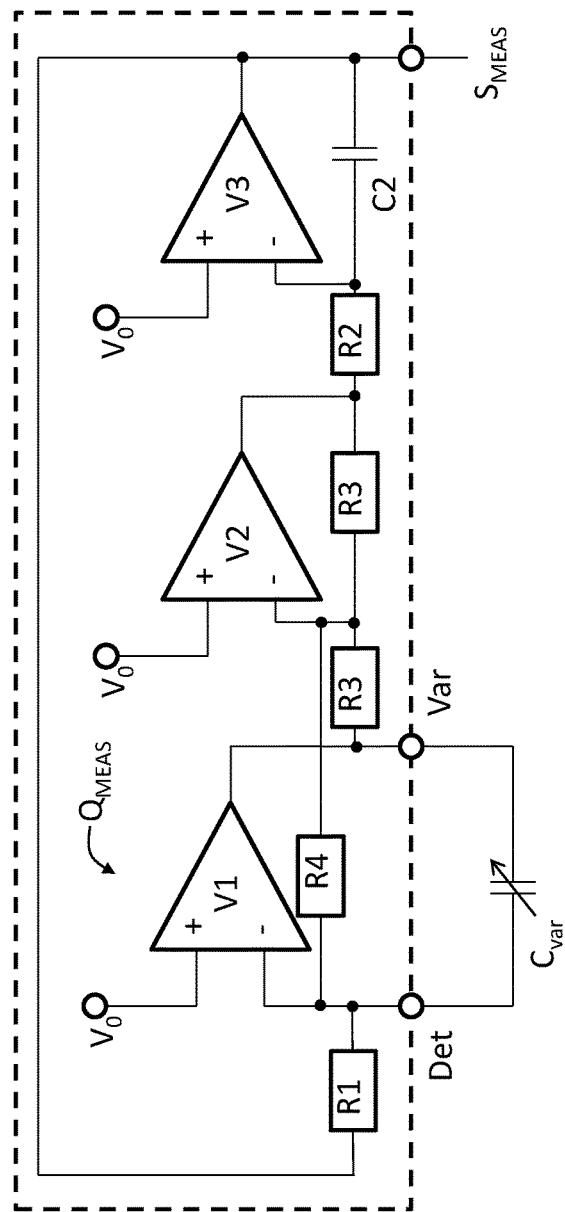

FIG. 12 shows a schematic simplified view of a suitable sine-wave oscillator using the example of the measuring oscillator ($Q_{MEAS}$) having an additional fourth resistor (R4).

Figure 13:
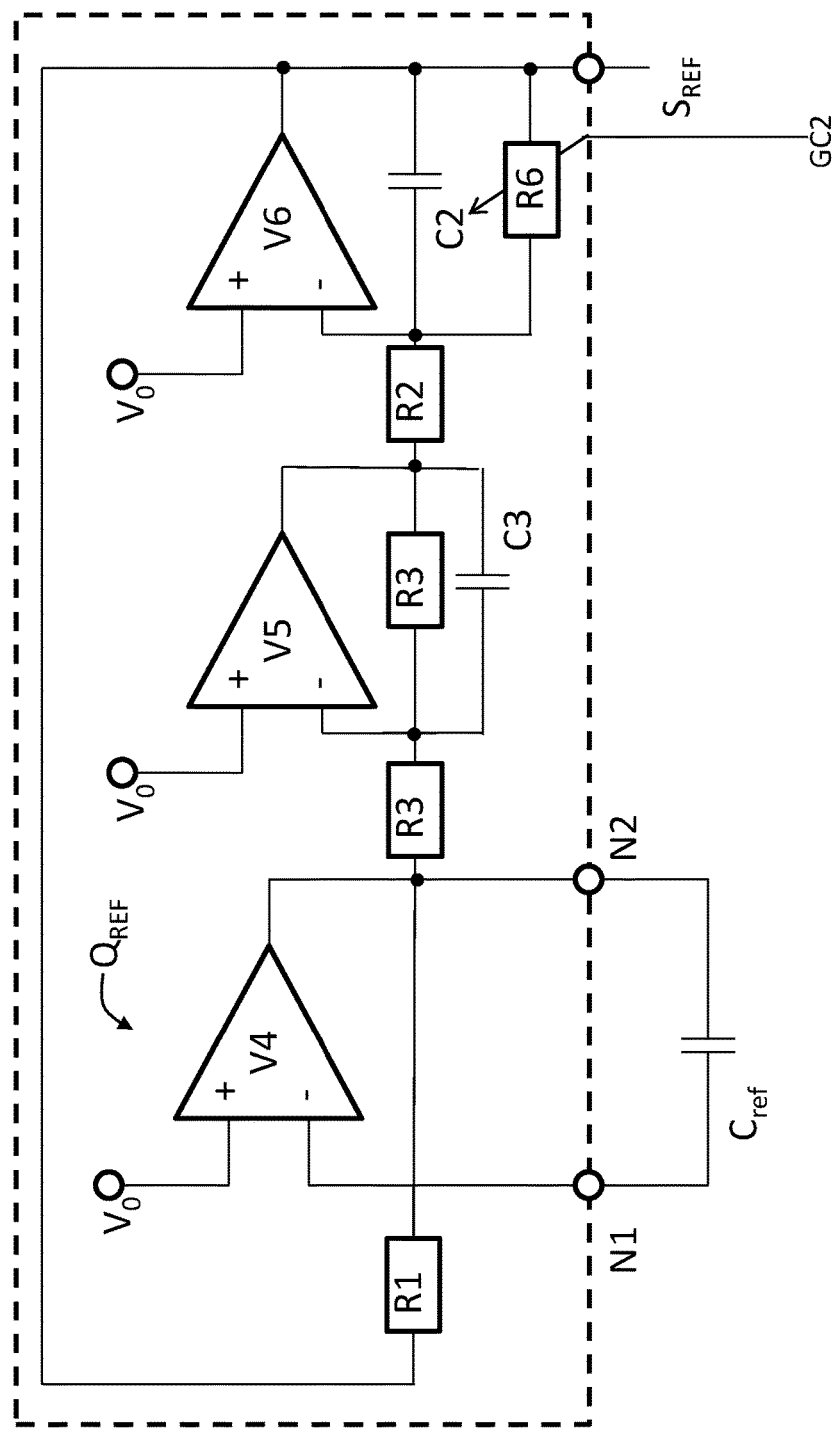

FIG. 13 shows a schematic simplified view of a suitable sine-wave oscillator using the example of the reference oscillator ($Q_{REF}$) having an additional adjustable fifth resistor (R5) and an additional capacitance (C3).

Figure 14:
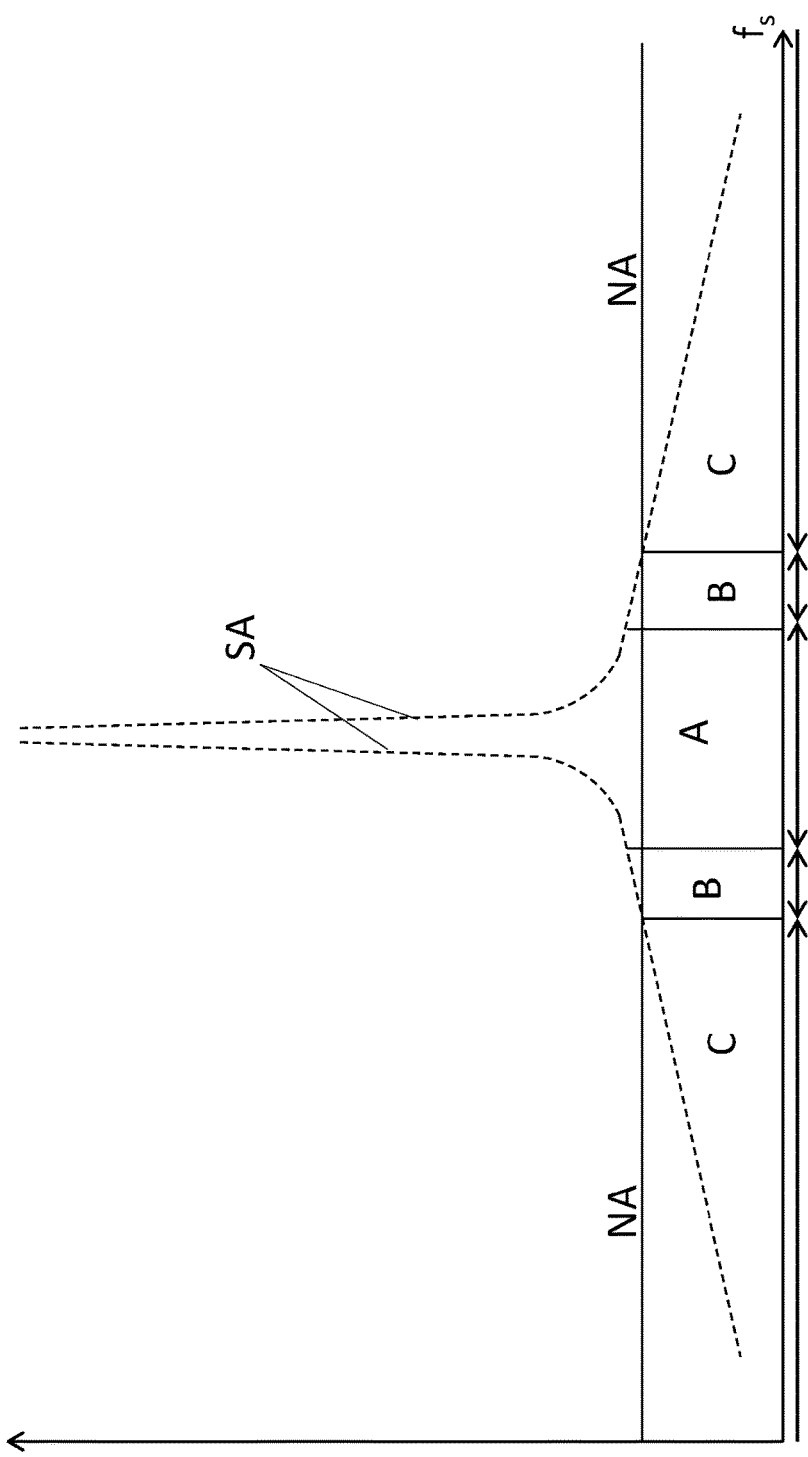

FIG. 14 shows the sensitivity curve of the oscillator circuits (y-axis) as a function of the interfering frequency ($f_s$) (x-axis).

Figure 15:
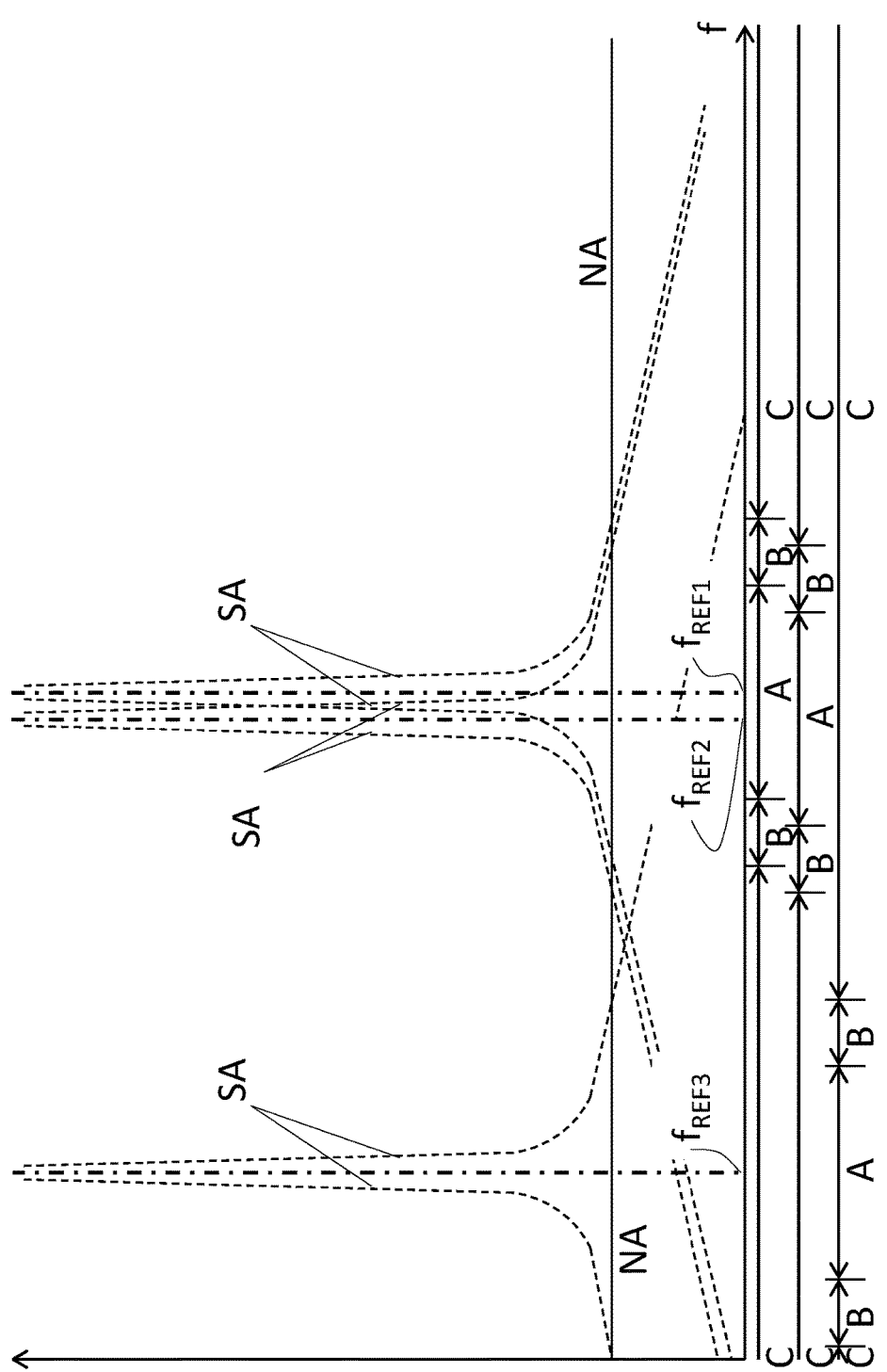

FIG. 15 serves for elucidating the frequency hopping.

LIST OF REFERENCE NUMERALS

/ Division block. The division block divides the second counter reading of the second output register of the second counter preferably by the first counter reading in the first output register of the first counter (CNT1) and outputs the result. This function can also be performed by a computer, in particular a microcomputer. This computer may be the computer which can possibly perform the function of the squaring block (^2).

^2 Squaring block. The squaring block squares the result signal of the division block (/) to provide the capacitance result (Out). This function can also be performed by a computer, in particular a microcomputer. This computer may be the computer which can possibly perform the function of the division block (^2).

A Frequency range (approximate representation) in which an interference leads to the amplitude control leaving its operating range;

$AC_{MEAS}$ Amplitude control of the measuring oscillator ($Q_{MEAS}$);

$AC_{REF}$ Amplitude control of the reference oscillator ($Q_{REF}$);

B Frequency range (approximate representation) in which the measuring signal is strongly changed (snapped onto the interfering frequency) but no interference can be directly detected.

C2 Second capacitance. The second capacitance is preferably integrated into the integrated microelectronic circuit (IC).

C3 Third capacitance;

CNT1 First counter. The first counter counts the high-frequency counting pulses of the high-frequency oscillator (HF-OSC) as long as the third digital or binary data flow (ds3) has a first logic level. When a second logic level appears at the third digital or binary data flow (ds3) the first counter stops counting and the first counting result appears at the output of the first counter. When a first logic level appears again at the third digital or binary data flow (ds3) the first counter starts counting again, preferably at zero. Preferably, the preceding first counting result is continued to be output.

CNT2 Second counter. The second counter counts the high-frequency counting pulses of the high-frequency oscillator (HF-OSC) as long as the fourth digital or binary data flow (ds4) has a first logic level. When a second logic level appears at the fourth digital or binary data flow (ds4) the second counter stops counting and the second counting result appears at the output of the second counter. When a first logic level appears again at the fourth digital or binary data flow (ds4) the second counter starts counting again, preferably at zero. Preferably, the preceding second counting result is continued to be output.

ck Clock input of a sample-and-hold circuit (S&H);

coeff Coefficient;

$C_{ref}$ Reference capacitance;

$C_{ref1}$ First reference capacitance;

$C_{ref2}$ Second reference capacitance;

$C_{var}$ Capacitance to be measured;

$C_{var1}$ First capacitance to be measured;

$C_{var2}$ Second capacitance to be measured;

D1 First divisor. The first divisor divides the frequency of the first digital or binary data flow (ds1) by a factor n and generates the third digital or binary data flow (ds3).

D2 Second divisor. The second divisor divides the frequency of the second digital or binary data flow (ds2) by a factor m and generates the fourth digital or binary data flow (ds4).

Det Second terminal of the measuring oscillator ($Q_{MEAS}$);

ds1 First digital or binary data flow. The first digital or binary data flow is preferably generated by the first analog-to-digital-converter (INV1).

ds2 Second digital or binary data flow. The second digital or binary data flow is preferably generated by the second analog-to-digital-converter (INV2).

ds3 Third digital or binary data flow. The third digital or binary data flow is preferably generated by the first divisor (D1).

ds4 Fourth digital or binary data flow. The fourth digital or binary data flow is preferably generated by the second divisor (D2).

$f_{MEAS}$ Frequency of the first oscillator signal ($S_{MEAS}$);

$f_{MEAS1}$ First frequency of the first oscillator signal ($S_{MEAS}$) and first measuring frequency;

$f_{MEAS2}$ Second frequency of the first oscillator signal ($S_{MEAS}$) and second measuring frequency;

$f_{MEAS3}$ Third frequency of the first oscillator signal ($S_{MEAS}$) and third measuring frequency;

$f_{REF}$ Frequency of the second oscillator signal ($S_{REF}$);

$f_{REF1}$ First frequency of the second oscillator signal ($S_{REF}$) and first reference frequency;

$f_{REF2}$ Second frequency of the second oscillator signal ($S_{REF}$) and second reference frequency;

$f_{REF3}$ Third frequency of the second oscillator signal ($S_{REF}$) and third reference frequency;

$f_s$ Interfering frequency;

GC1 Amplitude control of the measuring oscillator ($Q_{MEAS}$);

GC2 Amplitude control of the reference oscillator ($Q_{REF}$);

HF-OSC High-frequency oscillator which generates high-frequency counting pulses. Preferably, the frequency of the high-frequency counting pulses exceeds the measuring frequency ($f_{MEAS}$) and the reference frequency ($f_{REF}$) many times over.

INV1 First analog-to-digital converter. It is particularly preferred that the first analog-to-digital converter is an inverter.

INV2 Second analog-to-digital converter. It is particularly preferred that the second analog-to-digital converter is an inverter.

LSB Least significant bit;

LPF1 First low pass filter;

LPF2 Second low pass filter;

NA Desired useful amplitude;

N1 First terminal of the reference oscillator ($Q_{REF}$);

N1a First terminal of the reference oscillator ($Q_{REF}$);

N1b Third terminal of the reference oscillator ($Q_{REF}$);

N2 Second terminal of the reference oscillator ($Q_{REF}$);

NR1 Adjustable virtual negative resistor;

$Q_{MEAS}$ Measuring oscillator;

$Q_{REF}$ Reference oscillator;

R1 First resistor;

R2 Second resistor;

R3 Third resistor;

R4 Fourth resistor;

R5 Fifth resistor;

R6 Controlled sixth resistor;

SA Interfering amplitude at the internal reference voltage grid;

S&H Sample-and-hold circuit;

$S_{MEAS}$ First oscillator signal. The first oscillator signal is the output signal of the measuring oscillator ($Q_{MEAS}$).

$S_{REF}$ Second oscillator signal. The second oscillator signal is the output signal of the reference oscillator ($Q_{REF}$).

V1 First amplifier;

V2 Second amplifier;

V3 Third amplifier;

V4 Fourth amplifier;

V5 Fifth amplifier;

V6 Sixth amplifier;

Vamp Intermediate value signal;

Var First terminal of the measuring oscillator ($Q_{MEAS}$);

Var1 First terminal of the measuring oscillator ($Q_{MEAS}$);

Var2 Third terminal of the measuring oscillator ($Q_{MEAS}$);

vin Input of the sample-and-hold circuit (S&H);

vsh Output signal (vsh) of the sample-and-hold circuit;

Vsoll_amp Setpoint value.

The invention claimed is:

1. An apparatus for measuring a capacitance to be measured, comprising:
a sine-wave measuring oscillator adapted to be coupled with the capacitance to be measured;
a sine-wave reference oscillator adapted to be coupled with a reference capacitance;
wherein a measuring frequency of a measuring oscillator output signal of the sine-wave measuring oscillator is determined at least in part by the capacitance to be measured, wherein a reference frequency of a reference oscillator output signal of the sine-wave reference oscillator is determined at least in part by the reference capacitance; and an evaluation unit which produces a ratio of the reference frequency of the reference oscillator output signal and the measuring frequency of the measuring oscillator output signal and squares the ratio, wherein a result of squaring the ratio represents a value of the capacitance to be measured.

2. The apparatus according to claim 1, wherein the sine-wave measuring oscillator and the sine-wave reference oscillator respectively comprise same component parts except for the capacitance to be measured and the reference capacitance.

3. The apparatus according to claim 1, wherein each of the sine-wave measuring oscillator and the sine-wave reference oscillator are respectively configured as one of a ring oscillator and a state-variable oscillator.

4. The apparatus according to claim 1, wherein each of the sine-wave measuring oscillator and the sine-wave reference oscillator respectively comprise a control of an amplitude of a signal available at the capacitance to be measured and at the reference capacitance for preventing an overdrive.

5. The apparatus according to claim 4, wherein an overdrive of the control of the amplitude of the respective signal is adapted to be used for recognizing external sources of interference.

6. The apparatus according to claim 1, wherein the apparatus is adapted to be operated at one of (1) more than one reference frequency of the reference oscillator output signal, (2) more than one measuring frequency of the measuring oscillator output signal, and (3) more than one reference frequency of the reference oscillator output signal and more than one measuring frequency of the measuring oscillator output signal.

7. The apparatus according to claim 6, wherein:
the measuring frequency of the measuring oscillator output signal of the sine-wave measuring oscillator is dependent on a first first resistor and a first second resistor within the sine-wave measuring oscillator;
the reference frequency of the reference oscillator output signal of the sine-wave reference oscillator is dependent on a second first resistor and a second second resistor within the sine-wave reference oscillator;
the first first resistor and second first resistor have a first same value;
the first second resistor and second second resistor have a second same value; and
at least (1) both of the first first resistor and second first resistor or (2) both of the first second resistor and second second resistor in the respective sine-wave measuring oscillator and the sine-wave reference oscillator are adapted to be switched over or changed in a same manner.

8. A method for determining a value of a capacitance to be measured, comprising:

generating a sinusoidal first oscillator signal by means of a measuring oscillator whose measuring frequency is dependent on the value of the capacitance to be measured;

generating a sinusoidal second oscillator signal by means of a reference oscillator whose reference frequency is dependent on a reference capacitance;

generating a first digital or binary data flow from the sinusoidal first oscillator signal, by means of a first analog-to-digital converter, wherein the first digital or binary data flow assumes one of a first and a second logic state;

generating a second digital or binary data flow from the sinusoidal second oscillator signal, by means of a second analog-to-digital converter wherein the second digital or binary data flow assumes one of a first and a second logic state;

generating high-frequency counting pulses, by means of a high-frequency oscillator;

resetting a first counter for counting a first number of high-frequency counting pulses during a second logic state of the first digital flow;

resetting a second counter for counting a second number of high-frequency counting pulses during a second logic state of the second digital flow;

incrementing, once per each high-frequency counting pulse, during a first time when the first digital flow is in the second logic state, the first counter to generate a first counting value;

incrementing, once per each high-frequency counting pulse, during a second time when the second digital flow is in the second logic state, the second counter to generate a second counting value;

setting a first result value to be equal to the first counting value when the logic state of the first digital or binary data flow changes from the second logic state to the first logic state;

setting a second result value to be equal to the second counting value when the logic state of the second digital or binary data flow changes from the second logic state to the first logic state;

dividing, by a division block, the second result value by the first result value to generate a result of the division;

squaring, by a squaring block, the result of the division, to generate a result of the squaring; and outputting or using the result of the squaring as a measured value.

9. The method of claim 8, further comprising:
resetting the first counting value in the first counter subsequent to setting the first result value to be equal to the first counting value; and
resetting the second counting value in the second counter subsequent to setting the second result value to be equal to the second counting value.

* * * * *